US008953376B2

(12) United States Patent
Nam et al.

(10) Patent No.: US 8,953,376 B2
(45) Date of Patent: Feb. 10, 2015

(54) NONVOLATILE MEMORY DEVICE AND READ METHOD THEREOF

(75) Inventors: Sang-Wan Nam, Hwaseong-si (KR); Chiweon Yoon, Seoul (KR); Jung-Soo Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 351 days.

(21) Appl. No.: 13/401,151

(22) Filed: Feb. 21, 2012

(65) Prior Publication Data
US 2012/0224426 A1    Sep. 6, 2012

(30) Foreign Application Priority Data

Mar. 3, 2011    (KR) .................. 10-2011-0019022

(51) Int. Cl.
G11C 16/04    (2006.01)
G11C 16/06    (2006.01)
G11C 16/26    (2006.01)
H01L 27/115   (2006.01)

(52) U.S. Cl.
CPC ............ *G11C 16/26* (2013.01); *G11C 16/0483* (2013.01); *H01L 27/11519* (2013.01); *H01L 27/11556* (2013.01); *H01L 27/11565* (2013.01); *H01L 27/11582* (2013.01); *H01L 27/11524* (2013.01); *H01L 27/1157* (2013.01)
USPC ............ 365/185.11; 365/185.17; 365/185.18; 365/185.23; 365/185.2

(58) Field of Classification Search
CPC ......... G11C 16/26; G11C 16/08; G11C 16/28
USPC ............. 365/185.11, 185.17, 185.18, 185.23, 365/185.2
See application file for complete search history.

(56) References Cited

U.S. PATENT DOCUMENTS

| 7,509,588 | B2   | 3/2009  | Van Os et al. |
| 8,053,829 | B2 * | 11/2011 | Kang et al. ................. 257/326 |
| 8,450,176 | B2 * | 5/2013  | Son et al. ................... 438/261 |
| 8,553,466 | B2 * | 10/2013 | Han et al. ................. 365/185.29 |
| 8,559,224 | B2 * | 10/2013 | Han et al. ................. 365/185.11 |
| 2007/0157089 | A1 | 7/2007 | Van Os et al. |
| 2008/0310230 | A1 | 12/2008 | Kim et al. |
| 2010/0082890 | A1 | 4/2010 | Heo et al. |
| 2010/0171162 | A1 | 7/2010 | Katsumata et al. |
| 2010/0306583 | A1 | 12/2010 | Kim et al. |

FOREIGN PATENT DOCUMENTS

| JP | 2008-310949 A | 12/2008 |
| JP | 2010-102790 A | 5/2010 |
| JP | 2010-161132 A | 7/2010 |
| KR | 2007-0021370 A | 2/2007 |

(Continued)

*Primary Examiner* — Toan Le
(74) *Attorney, Agent, or Firm* — Harness, Dickey & Pierce, P.L.C.

(57) ABSTRACT

According to example embodiments, a read method of a nonvolatile memory device includes Disclosed is a read method of a nonvolatile memory device which includes selecting one of a plurality of vertical strings in a nonvolatile memory device, judging a channel length between a common source line and a selected one of the plurality of vertical strings, selecting a sensing manner corresponding to the judged channel length, and performing a sensing operation according to the selected sensing manner. The plurality of vertical strings may extend in a direction perpendicular to a substrate of the nonvolatile memory device.

22 Claims, 22 Drawing Sheets

(56) References Cited

FOREIGN PATENT DOCUMENTS

| KR | 2010-0081943 A | 9/2008 |
| KR | 10-0881520 B1 | 11/2008 |
| KR | 2009-0049373 A | 5/2009 |
| KR | 10-0909968 B1 | 7/2009 |

* cited by examiner

NONVOLATILE MEMORY DEVICE AND READ METHOD THEREOF

CROSS-REFERENCE TO RELATED APPLICATIONS

This application claims foreign priority under 35 U.S.C. §119 to the benefit of Korean Patent Application No. 10-2011-0019022, filed Mar. 3, 2011, the entire disclosure of which is incorporated by reference herein.

BACKGROUND

Example embodiments relate to a nonvolatile memory device and/or a read method thereof.

A semiconductor memory device is a memory device may be fabricated using semiconductors such as silicon (Si), germanium (Ge), gallium arsenide (GaAs), indium phosphide (InP), and the like. Semiconductor memory devices may be classified as volatile memory devices and nonvolatile memory devices.

Volatile memory devices may lose stored contents at power-off. Examples of volatile memory devices include static RAM (SRAM), dynamic RAM (DRAM), synchronous DRAM (SDRAM), and the like. Nonvolatile memory devices may retain stored contents even at power-off. Nonvolatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like. Flash memory device may be NOR type or NAND type.

Semiconductor memory devices with a three-dimensional array structure are being developed.

SUMMARY

According to example embodiments of inventive concepts, a read method of a nonvolatile memory device includes selecting one of a plurality of vertical strings in a nonvolatile memory device, the plurality of vertical strings extending in a direction perpendicular to a substrate of the nonvolatile memory device. The method may further include judging a channel length between a common source line and a selected one of the plurality of vertical strings, selecting a sensing manner corresponding to the judged channel length, and performing a sensing operation according to the selected sensing manner.

The nonvolatile memory device may include two vertical strings connected with a bit line between at least two word line cuts.

The plurality of vertical strings of the nonvolatile memory device may be arranged in a zigzag structure between at least two word line cuts.

At least one corresponding vertical string of the plurality of vertical strings may include at least one string selection transistor connected between a bit line and a channel of the corresponding vertical string. The at least one string selection transistor may include a gate connected with a string selection line. The corresponding vertical string may include a plurality of cell transistors connected in series to form a channel of the corresponding vertical string. The plurality of cell transistors may include gates connected with word lines, respectively. The corresponding vertical string may include at least one ground selection transistor connected between the channel of the corresponding vertical string and the common source line, and the at least one ground selection transistor may include a gate connected with a ground selection line. At least one of the string selection transistor, the plurality of cell transistors, and the at least one ground selection transistor may be stacked on the substrate.

The sensing operation may include controlling a bias voltage of the selected vertical string according to the selected sensing manner.

The sensing operation may include controlling bias voltages of the word lines according to the selected sensing manner.

The sensing operation may include controlling a voltage of the ground selection line according to the selected sensing manner.

The sensing operation may include controlling a develop time according to the selected sensing manner.

If the judged channel length is over a reference value, the sensing operation may include making the develop time longer than a target develop time according to the selected sensing manner.

The sensing operation may include controlling a bias voltage of the selected vertical string and a develop time the sensing operation according to the selected sensing manner.

According to example embodiments of inventive concepts, a nonvolatile memory device includes a memory cell array. The memory cell array may include a plurality of memory blocks. Each memory block may include a plurality of vertical strings extending in a direction perpendicular to a substrate. The nonvolatile memory device may further include an address decoder configured to decode an input address to generate a block selection signal, a block gating unit configured to select one of the plurality of memory blocks in response to the block selection signal, a read/write circuit connected with the memory cell array via bit lines and configured to exchange data with an external device, and a control logic configured to control the block gating unit, the address decoder, and the read/write circuit. The control logic may be configured to perform a read operation using a sensing manner selected according to a channel length between a selected vertical string and a common source line.

Each of the vertical strings may include at least one dummy cell containing a gate connected with a dummy word line.

Each of the vertical strings may include an upper string selection transistor connected with one end of a bit line and including a gate connected with an upper string selection line, and a lower string selection transistor connected between the upper string selection transistor and a channel of a corresponding vertical string and including a gate connected with a lower string selection line.

At least one corresponding vertical string of the plurality of vertical strings may include an upper ground selection transistor connected with one end of a channel of the corresponding vertical string. The ground selection transistor may include a gate connected with an upper ground selection line. The corresponding vertical string may include a lower ground selection transistor connected between the upper ground selection transistor and the common source line. The lower ground selection transistor may include a gate connected with a lower ground selection line.

Each of the memory blocks may include at least two vertical strings in a zigzag pattern between at least two word line cuts.

Each of the memory blocks may include an even vertical string connected with an even bit line and an odd vertical string connected with an odd bit line. The even vertical string and the odd vertical string may be arranged in a zigzag shape.

A channel length between the even vertical string and the common source line may be shorter than a channel length between the odd vertical string and the common source line, and a voltage of a ground selection line when the odd vertical string is selected may be higher than a voltage of the ground selection line when the even vertical string is selected.

A channel length between the even vertical string and the common source line may be shorter than a channel length between the odd vertical string and the common source line, and a develop time of a sensing operation when the odd vertical string is selected may be longer than a develop time of a sensing operation when the even vertical string is selected.

Each of the memory blocks may include three vertical strings in a zigzag pattern between at least two word line cuts.

Each of the memory blocks may include four vertical strings in a zigzag pattern between at least two word line cuts.

According to example embodiments, a nonvolatile memory device includes a plurality of memory blocks. Each memory block may include a first string and a second string extending vertically from a substrate, a first channel length between the first string and a first common source line, and a second channel length between the second string and the first common source line. The second channel length may be greater than the first channel length. The nonvolatile memory device may further include a control logic configured to adjust a sensing operation on at least one of the first string and the second string, such that the sensing operation compensates for the second channel length being greater than the first channel length.

The control logic may be configured to adjust the sensing operation by applying a first read pass voltage to at least one ground selection line of the first string when the first string is accessed, and by applying a second read pass voltage to at least one ground selection line of the second string when the second string is accessed. The second read pass voltage may be higher than the first read pass voltage.

The control logic may be configured to adjust the sensing operation by adjusting a develop time of the sensing operation based on whether the first string or second string is accessed.

At least one of the memory blocks may include a merged word line structure.

According to example embodiments, a memory system may include at least one of the foregoing nonvolatile memory devices, and a processor operatively connected to the at least one nonvolatile memory device.

BRIEF DESCRIPTION OF THE FIGURES

The foregoing and other features and advantages of inventive concepts will become apparent from the following description of non-limiting embodiments, as illustrated in the following figures, in which like reference numerals refer to like parts throughout the various figures unless otherwise specified. The drawings are not necessarily to scale, emphases instead being placed upon illustrating the principles of inventive concepts. In the drawings.

DETAILED DESCRIPTION

Figure 1:
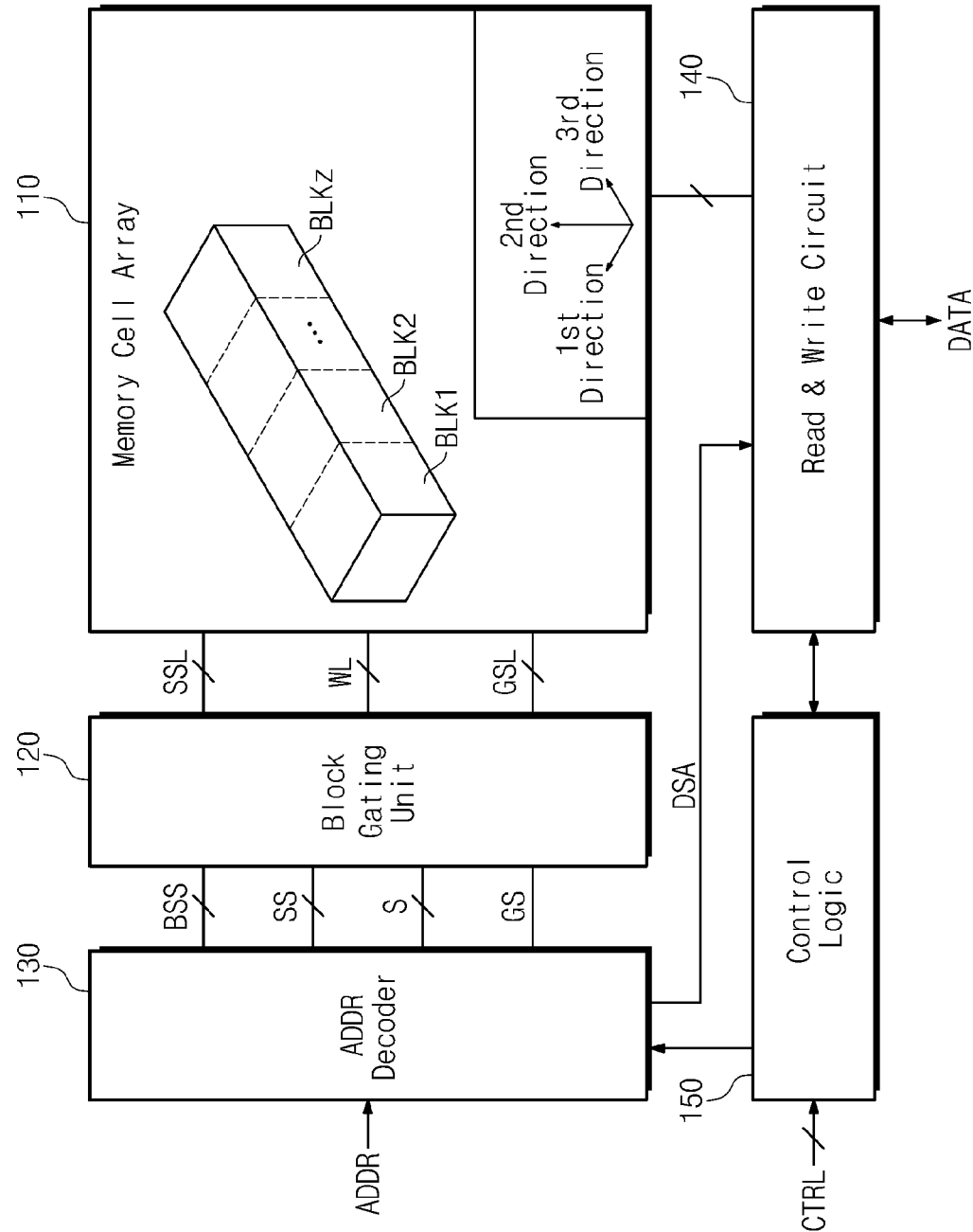
FIG. 1 is a block diagram illustrating a nonvolatile memory device according to example embodiments of inventive concepts.

Example embodiments of inventive concepts will be described more fully hereinafter with reference to the accompanying drawings, in which some example embodiments of inventive concepts are shown. Example embodiments of inventive concepts may, however, be embodied in many different forms and should not be construed as limited to the embodiments set forth herein. Rather, these example embodiments are provided so that this disclosure will be thorough and complete, and will fully convey the scope of inventive concepts to those of ordinary skill in the art. In the drawings, the size and relative sizes of layers and regions may be exaggerated for clarity. Like numbers refer to like elements throughout, thus their description will be omitted.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a nonvolatile memory device according to example embodiments of inventive concepts. Referring to FIG. 1, a nonvolatile memory device 100 may include a memory cell array 110, a block gating unit 120, an address decoder 130, a read/write circuit 140, and a control logic 150.

The memory cell array 110 may include a plurality of memory blocks BLK1 to BLKz (z being a positive integer of 2 or more). Herein, the memory blocks BLK1 to BLKz may constitute a structure stacked along a second direction (or a vertical direction) on a plane extending first and third directions.

Each of the memory blocks BLK1 to BLKz may include a plurality of vertical strings extending in a direction perpendicular to a substrate. Each vertical string may include a plurality of memory cells stacked along a direction perpendicular to the substrate. That is, the memory cells may be on the substrate along rows and columns, and may be stacked in a direction perpendicular to the substrate to form a three-dimensional structure. According to example embodiments of inventive concepts, the memory cell array 110 may include a plurality of memory cells each storing one or more bits of data.

The block gating unit 120 may be coupled with the memory cell array 110 via string selection lines SSL, word lines WL, and ground selection lines GSL. The block gating unit 120 may be coupled with the address decoder 130 via string lines SS, selection lines S, and ground lines GS. The block gating unit 120 may receive a block selection signal BSS from the address decoder 130.

The block gating unit 120 may select a memory block of the memory cell array 110 in response to the block selection signal BBS. The block gating unit 120 may electrically connect string selection lines SSL, word lines WL, and a ground selection line(s) of the selected memory block with the string lines SS, the selection lines S, and the ground line(s) GS.

The address decoder 130 may be coupled with the memory cell array 110 via word lines WL, string selection lines SSL, and ground selection lines GSL. The address decoder 130 may be configured to operate responsive to the control of the control logic 150. The address decoder 120 may receive an address ADDR from an external device.

The address decoder 130 may be configured to decode a row address of the input address ADDR. The address decoder 120 may be configured to select a word line corresponding to a decoded row address of the word lines WL. The address decoder 130 may be configured to select a string selection line and a ground selection line corresponding to the decoded row address of the string selection lines SSL and the ground selection lines GSL.

The address decoder 130 may be configured to decode a column address of the input address ADDR. The address decoder 130 may provide the decoded column address DCA to the read/write circuit 140.

According to example embodiments of inventive concepts, the address decoder 130 may include a row decoder decoding a row address, a column decoder decoding a column address, and an address buffer storing the input address ADDR.

The read/write circuit 140 may be coupled with the memory cell array 110 via bit lines BL. The read/write circuit 140 may be configured to exchange data with an external device. The read/write circuit 140 may operate responsive to the control of the control logic 150. The read/write circuit 140 may select bit lines BL in response to the decoded column address DCA provided from the address decoder 130.

According to example embodiments of inventive concepts, the read/write circuit 140 may receive data from an external device to write it in the memory cell array 110. The read/write circuit 140 may read data from the memory cell array 110 to output it to the external device. The read/write circuit 140 may read data from a first storage area of the memory cell array 110 to write it in a second storage area thereof. That is, the read/write circuit 140 may perform a copy-back operation.

According to example embodiments of inventive concepts, the read/write circuit 140 may include constituent elements such as a page buffer (or, a page register), a column selecting circuit, a data buffer, and the like. According to example embodiments of inventive concepts, the read/write circuit 140 may include constituent elements such as a sense amplifier, a write driver, a column selecting circuit, a data buffer, and the like.

The control logic 150 may be coupled with the address decoder 130 and the read/write circuit 140. The control logic 150 may be configured to control an overall operation of the nonvolatile memory device 100. The control logic 150 may perform a sensing operation (used at a read operation or a verification read operation) using one method selected from a plurality of sensing methods. Selection of the sensing methods may be made according to a channel length between a selected vertical string and a common source line.

The nonvolatile memory device 100 according to according to example embodiments of inventive concepts may maintain the same sensing property on asymmetrically structured vertical strings by performing a sensing operation using different sensing methods according to a channel length between a selected vertical string and a common source line.

The reliability of a read operation may be improved by performing a sensing operation differently according to a channel length between a selected vertical string and a common source line even at an asymmetric structure.

Figure 2:
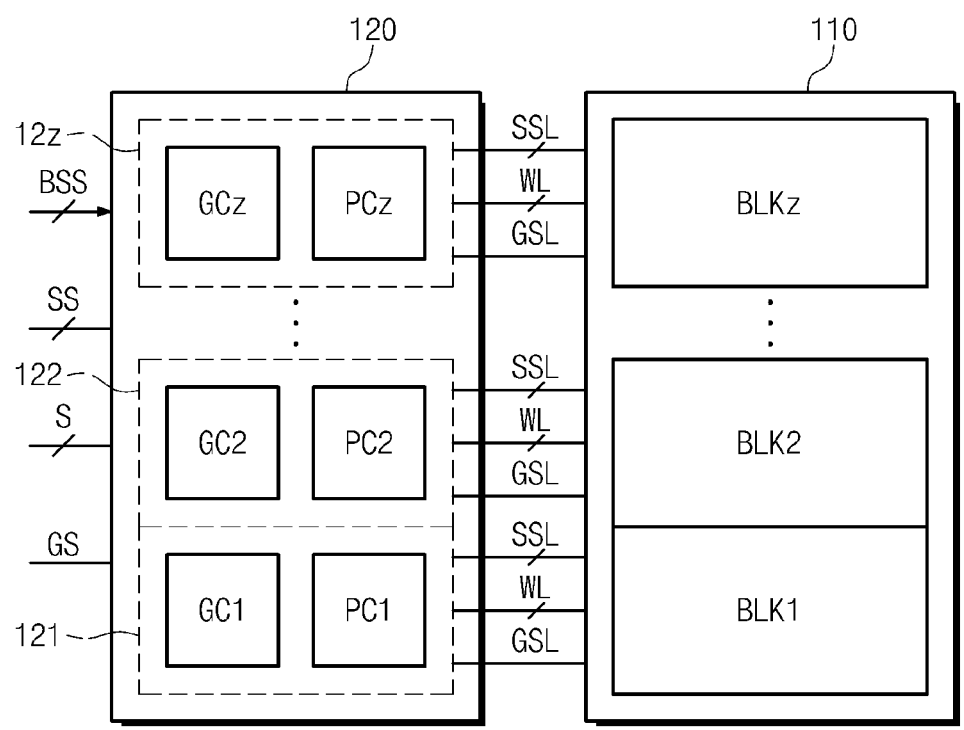
FIG. 2 is a block diagram illustrating a memory cell array and a block gating unit in FIG. 1 according to example embodiments of inventive concepts.

FIG. 2 is a block diagram illustrating a memory cell array and a block gating unit in FIG. 1 according to example embodiments of inventive concepts. Referring to FIG. 2, a memory cell array 110 may include a plurality of memory blocks BLK1 to BLKz, each of which is connected with a block gating unit 120 via a plurality of string selection lines SSL, a plurality of word lines WL, and a ground selection line GSL.

The block gating unit 120 may include a plurality of gating circuits 121 to 12z corresponding to the plurality of memory blocks BLK1 to BLKz, respectively. Each of the gating circuits 121 to 12z may include a ground circuit and a pass circuit. For example, the gating circuit 121 may include a ground circuit GC1 and a pass circuit PC1, and the gating circuit 12z may include a ground circuit GCz and a pass circuit PCz.

A pass circuit corresponding to a selected memory block among the pass circuits PC1 to PCz may electrically connect string selection lines SSL, word lines WL, and a ground selection line GSL of the selected memory block with string lines SS, selection lines S, and a ground line GS in response to a block selection signal BSS.

Ground circuits corresponding to unselected memory blocks among the ground circuits GC1 to GCz may supply a low voltage to string selection lines SSL, word lines WL, and a ground selection line GSL of the respective unselected memory blocks. For example, the ground circuits GC1 to GCz may supply a ground voltage VSS.

Figure 3:
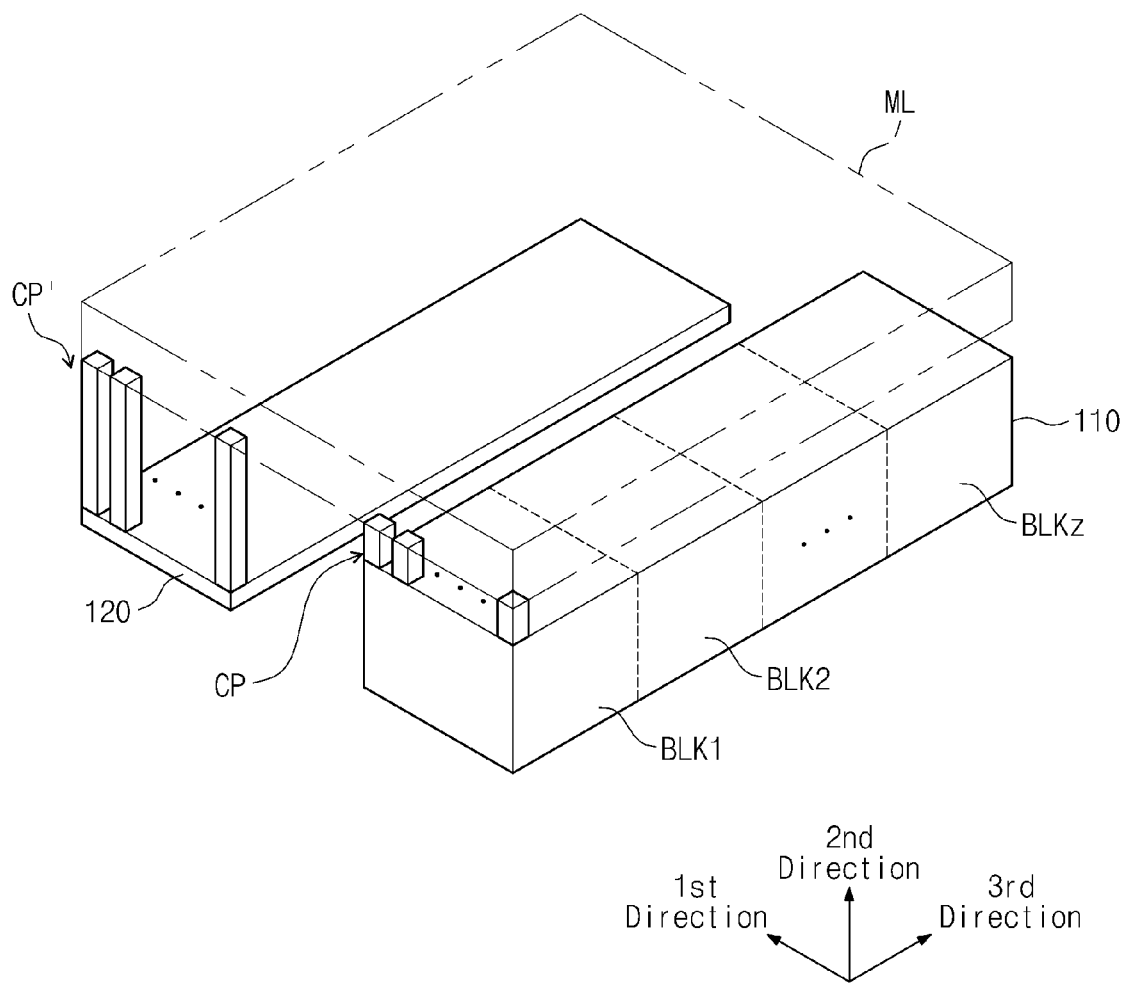
FIG. 3 is a perspective view illustrating a memory cell array and a block gating unit in FIG. 1.

FIG. 3 is a perspective view illustrating a memory cell array and a block gating unit in FIG. 1. Referring to FIG. 3, a memory cell array 110 may have a three-dimensional structure (or, a vertical structure). For example, memory blocks BLK1 to BLKz may form a structure stacked along a second direction on a plane extending first and third directions.

The block gating unit 120 may have a planar structure. The block gating unit 120 may be formed on a plane extending along the first and third directions.

The memory cell array 110 and the block gating unit 120 may be interconnected via metal layers ML. The metal layer ML may be formed over the memory cell array 110 and the block gating unit 120. The memory cell array 110 may be connected with the metal layer ML via contact plugs CP. The block gating unit 120 may be connected with the metal layer ML via contact plugs CP.

In FIG. 3, there contact plugs CP and CP' are illustrated in relation to a part of the memory cell array 110 and the block gating unit 120. However, contact plugs CP and CP' can be on a top of the memory cell array 110 and the block gating unit 120 without location limitation.

According to example embodiments of inventive concepts, a memory block of the inventive concept may be formed to have such a structure that two word lines are merged into one, that is, a merged word line structure.

Figure 4:
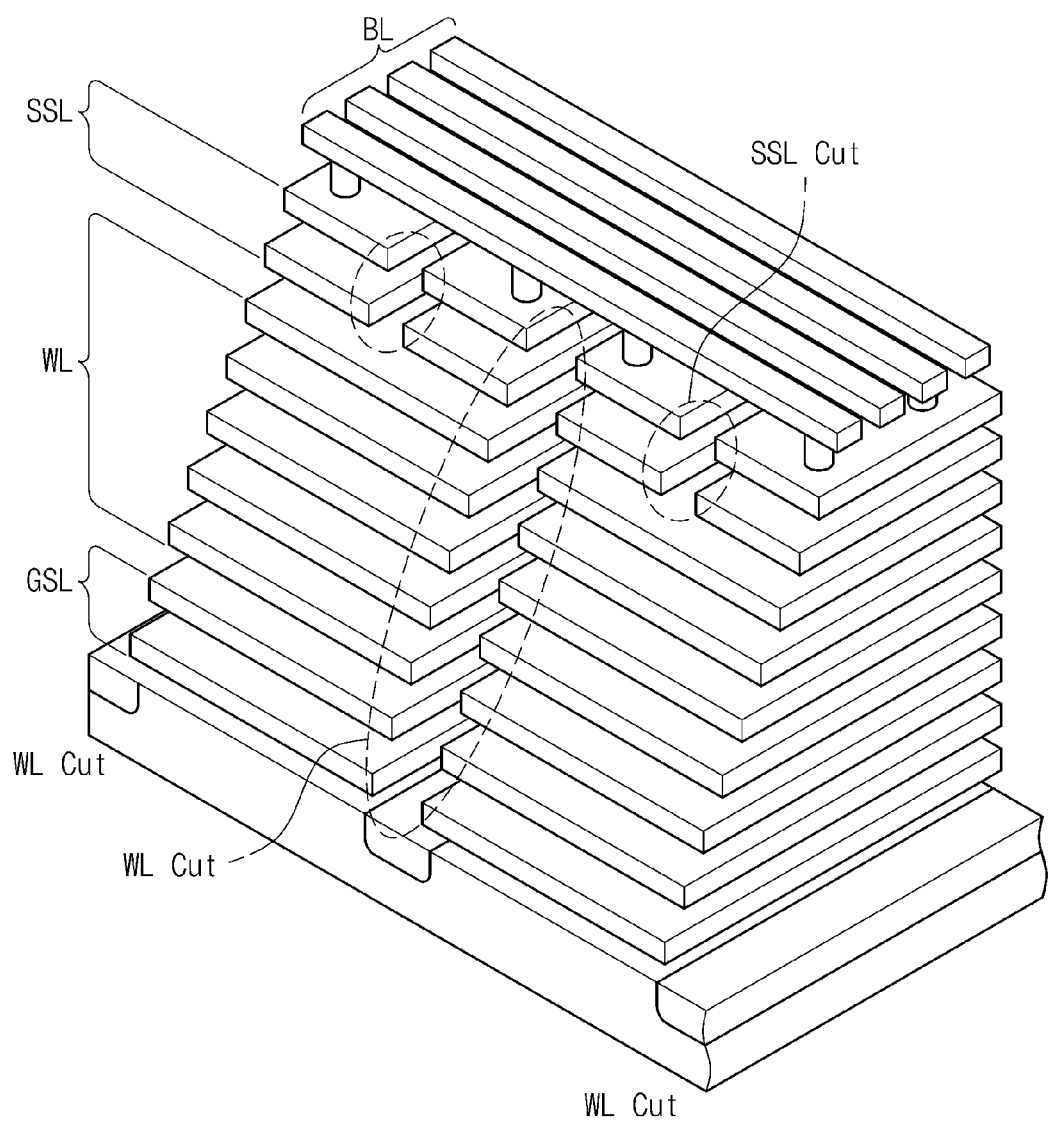
FIG. 4 is a perspective view a memory block with a merged word line structure according to example embodiments of inventive concepts.

FIG. 4 is a perspective view a memory block with a merged word line structure according to example embodiments of inventive concepts. Referring to FIG. 4, at least one ground selection line GSL, a plurality of word lines WL, and at least one string selection line SSL may be stacked on a substrate between word line cuts WL Cut. Herein, the at least one string selection line SSL may be separated by a string selection line cut.

A plurality of pillars may penetrate the at least one ground selection line GSL, the plurality of word lines WL, and the at least one string selection line SSL. Herein, the at least one ground selection line GSL, the plurality of word lines WL, and the at least one string selection line SSL may be formed to have a shape, such as a planar shape or a rectangular shape, but example embodiments are not limited thereto. Further, bit lines BL may be connected with upper surfaces of the plurality of pillars.

Figure 5:
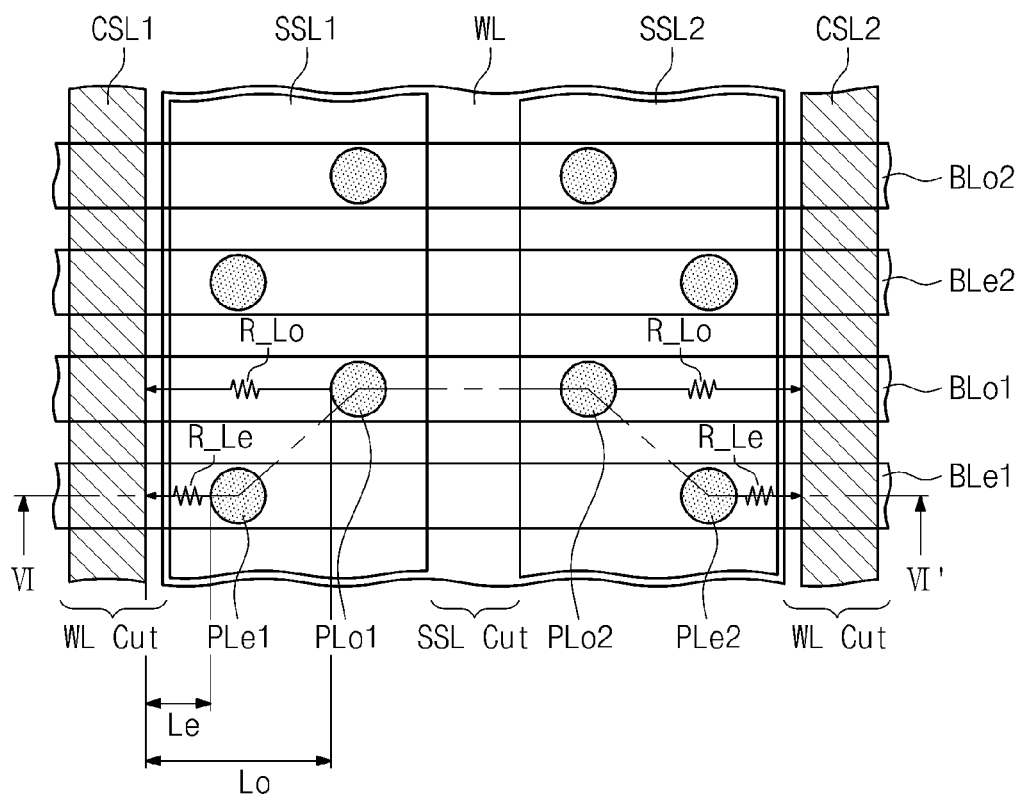
FIG. 5 is a diagram illustrating a top of a memory block illustrated in FIG. 4.

FIG. 5 is a diagram illustrating a top of a memory block illustrated in FIG. 4. Referring to FIG. 5, common source lines CSL1 and CSL2 may exist within word line cuts WL Cut, and a string selection line cut SSL Cut may exist between the word line cuts WL Cut.

Since a channel length Le from even pillars PLe1 and PLe2 to the common source lines CSL1 and CSL2 may be different from a channel length Lo from odd pillars PLo1 and PLo2 to the common source lines CSL1 and CSL2, a channel resistance R_Le from even pillars PLe1 and PLe2 to the common source lines CSL1 and CSL2 may be different from a channel resistance R_Lo from odd pillars PLo1 and PLo2 to the common source lines CSL1 and CSL2. For example, the channel resistance R_Le from even pillars PLe1 and PLe2 to the common source lines CSL1 and CSL2 may be smaller than the channel resistance R_Lo from odd pillars PLo1 and PLo2 to the common source lines CSL1 and CSL2.

Figure 6:
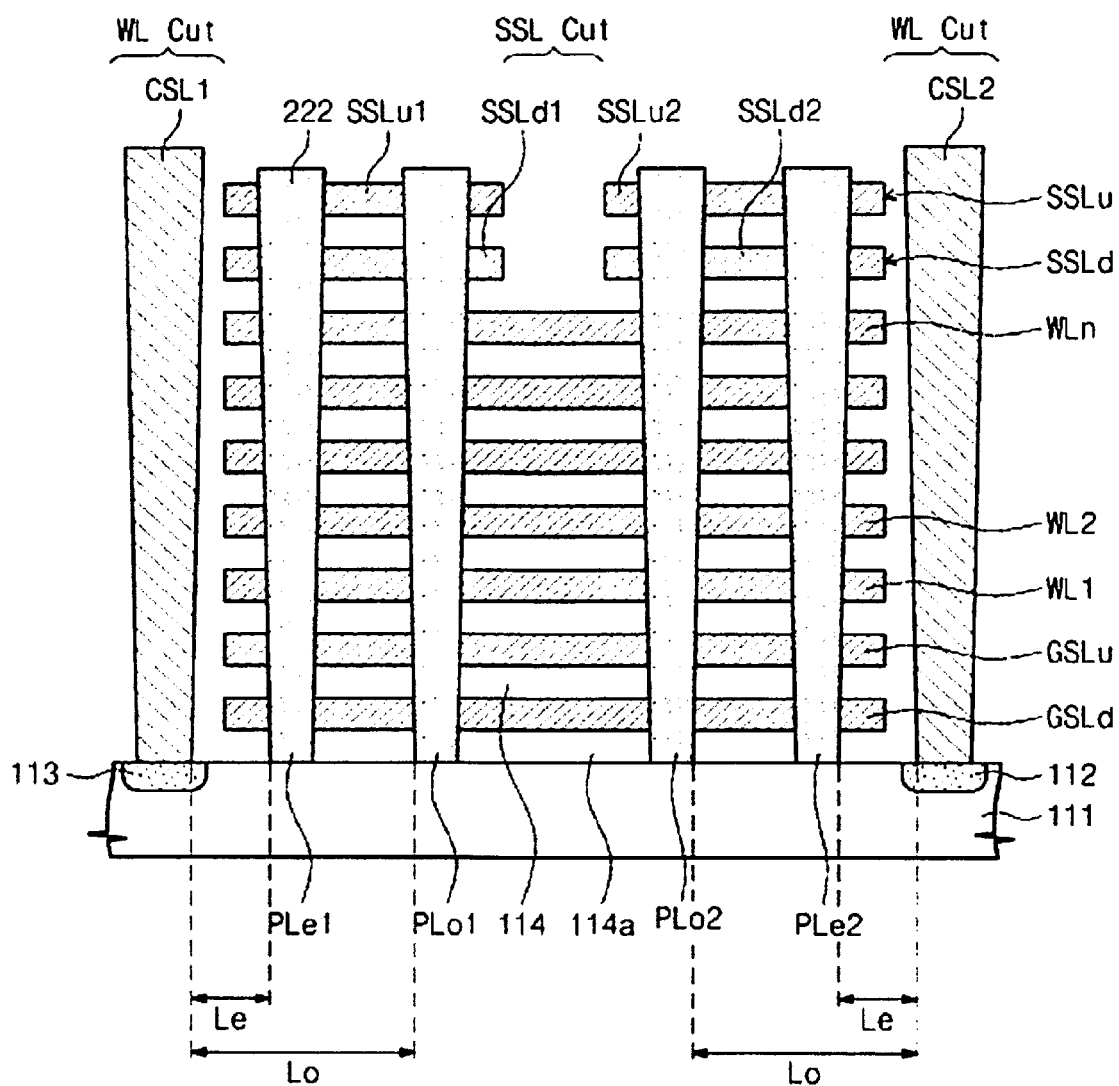
FIG. 6 is a cross-sectional view taken along a line VI-VI' in FIG. 5 according to example embodiments of inventive concepts.

FIG. 6 is a cross-sectional view taken along a line VI-VI' in FIG. 5 according to example embodiments of inventive concepts.

A substrate 111 may be a well having a first conductivity type. The substrate 111 may be a p-well in which a Group III element such as boron or aluminum is injected. For example, the substrate 111 may be a pocket p-well within an n-well. Below, it is assumed that the substrate 111 is a p-well (or, a pocket p-well). However, the substrate 111 is not limited to p-type.

A plurality of doping regions 112 and 113 extending along a first direction may be in the substrate 111. The doping regions 112 and 113 may be spaced apart along a third direction. The doping regions 112 and 113 may have a second conductive type different from that of the substrate 111. For example, the doping regions 112 and 113 may be n-type. The doping regions 112 and 113 may be doped with a Group V element such as phosphorus, but example embodiments are not limited thereto. Below, it is assumed that the doping regions 112 and 113 are n-type. However, the doping regions 112 and 113 are not limited to the n-type.

Between the doping regions 112 and 113, a plurality of insulation materials 114 and 114a may be arranged sequentially along a second direction (e.g., a direction perpendicular to the substrate 111). The insulation materials 114 and 114a may be spaced apart along the second direction. According to example embodiments, the insulation materials 114 and 114a may extend along a first direction. For example, the insulation materials 114 and 114a may include an insulation material such as a dielectric, for example silicon oxide, but example embodiments are not limited thereto. According to example embodiments, a thickness of the insulation material 114a contacting with the substrate 111 may be thinner than that of the insulation materials 114.

Between the doping regions 112 and 113, a plurality of pillars PLe1, PLe2, PLo1, and PLo2 may be arranged sequentially along the first direction so as to penetrate the plurality of insulation materials 114 and 114a along the second direction. For example, the pillars PLe1, PLe2, PLo1, and PLo2 may contact with the substrate 111 through the insulation materials 114 and 114a. Herein the pillars PLe1 and PLe2 may be connected with any one even bit line, and the pillars PLo1 and PLo2 may be connected with any one odd bit line.

According to example embodiments, the pillars PLe1, PLe2, PLo1, and PLo2 may be formed of a plurality of materials, respectively. For example, the pillars PLe1, PLe2, PLo1, and PLo2 may include channel films and inner materials. In each of the pillars PLe1, PLe2, PLo1, and PLo2, an inner material and a channel film surrounding the inner material may be provided. The channel films may include a semiconductor material (e.g., silicon) having the first conductive type. For example, the channel films may include a semiconductor material (e.g., silicon, for example polycrystalline silicon but example embodiments are not limited thereto) having the same conductive type as that of the substrate 111. Below, it is assumed that the channel films include p-type silicon. However, the channel films are not limited to p-type silicon. For example, the channel films may include an intrinsic semiconductor.

The inner materials may include an insulation material. For example, the inner materials may include an insulation material such as a dielectric, for example silicon oxide, but example embodiments are not limited thereto. Alternatively, the inner materials may include air gap.

Information storage films may be on exposed surfaces of the insulation materials 114 and the pillars PLe1, PLe2, PLo1, and PLo2. According to example embodiments, a thickness of the information storage film may be less than half a distance between the insulation materials 114. According to example embodiments, the pillars PLe1, PLe2, PLo1, and PLo2 may be arranged in a zigzag shape. This arrangement may enable a cell area to be reduced.

Between the doping regions 112 and 113, conductive materials may be on exposed surfaces of the information storage films. For example, the conductive material extending along the first direction may be between an information storage film at a lower surface of an upper insulation material of the insulation materials 114 and 114a and the information storage film at an upper surface of a lower insulation material of the insulation materials 114 and 114a.

A plurality of drains may be on the plurality of pillars PLe1, PLe2, PLo1, and PLo2, respectively. Bit lines extending in the third direction may be on the drains so as to be spaced apart from one another along the first direction. The bit lines may be coupled with the drains. According to example embodiments of inventive concepts, the drains and the bit lines may be connected via contact plugs (not shown). The bit lines may include a metallic conductive material, or a non-metallic conductive material such as polysilicon that may be doped, but example embodiments are not limited thereto.

Each of the pillars PLe1, PLe2, PLo1, and PLo2 may constitute a vertical string with adjacent information storage films and adjacent conductive materials. That is, the pillars PLe1, PLe2, PLo1, and PLo2 may form a plurality of vertical strings with the information storage films and the plurality of conductive materials. Each of the vertical strings may include a plurality of cell transistors which are stacked in a direction perpendicular to the substrate 111.

A string selection line SSL may include an upper string selection line SSLu and a lower string selection line SSLd. Herein, the upper string selection line SSLu and the lower string selection line SSLd may be partitioned by a string selection line cut SSL Cut into upper string selection lines SSLu1 and SSLu2 and lower string selection lines SSLd1 and SSLd2. However, the string selection line SSL is not limited thereto. The string selection line SSL can be implemented by at least one line.

A ground selection line GSL may include an upper ground selection line GSLu and a lower ground selection line GSLd. However, the ground selection line GSL is not limited thereto. The ground selection line GSL can be implemented by at least one line.

A common source line CSL may include first and second common source lines CSL1 and CSL2. Although not illustrated in FIG. 6, the common source lines CSL1 and CSL2 may be interconnected electrically. The common source lines CSL1 and CSL2 may extend on the doping regions 112 and 113, and may be included within a word line cut.

As illustrated in FIG. 6, for the merged word line architecture, a channel length Le from even pillars PLe1 and PLe2 to the common source lines CSL1 and CSL2 may be different from a channel length Lo from odd pillars PLo1 and PLo2 to the common source lines CSL1 and CSL2. Herein, the channel lengths Le and Lo may be a channel length of a ground selection transistor GST. For example, the channel length Le from even pillars PLe1 and PLe2 to the common source lines CSL1 and CSL2 may be shorter than the channel length Lo from odd pillars PLo1 and PLo2 to the common source lines CSL1 and CSL2.

Figure 7A:
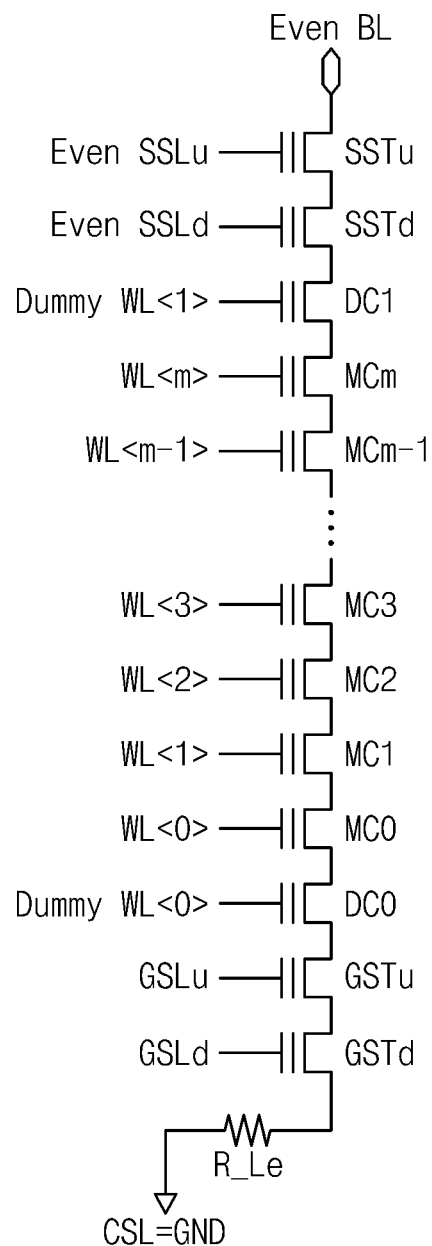
FIG. 7A is a circuit diagram illustrating a vertical string (even vertical string) corresponding to even pillars PLe1 and PLe2 in a merged word line structure according to example embodiments of inventive concepts.

FIG. 7A is a circuit diagram illustrating a vertical string (even vertical string) corresponding to even pillars PLe1 and PLe2 in a merged word line structure according to example embodiments of inventive concepts.

Referring to FIG. 7A, a vertical string may include string selection transistors SSTu and SSTd between an even bit line and a channel of the vertical string, a plurality of serially connected memory cells MC0 to MCm formed at the channel of the vertical string, ground selection transistors GSTu and GSTd connected between the channel of the vertical string and a common source line CSL, a dummy cell DC0 connected between the memory cell MC0 and the ground selection transistor GSTu, and a dummy cell DC1 connected between the memory cell MCm and the string selection transistor SSTd.

Herein, the string selection transistors SSTu and SSTd may have gates connected with string selection lines SSLu and SSLd, respectively, and the memory cells MC0 to MCm may have gates connected with word lines WL<0> to WL<m>, respectively. The ground selection transistors GSTu and GSTd may have gates connected with ground selection lines GSLu and GSLd, respectively, and the dummy cells DC0 and DC1 may have gates connected with dummy word lines Dummy WL<0> and Dummy WL<1>, respectively.

As illustrated in FIG. 7A, the even vertical string may be connected with the common source line CSL via a channel resistance R_Le.

Figure 7B:
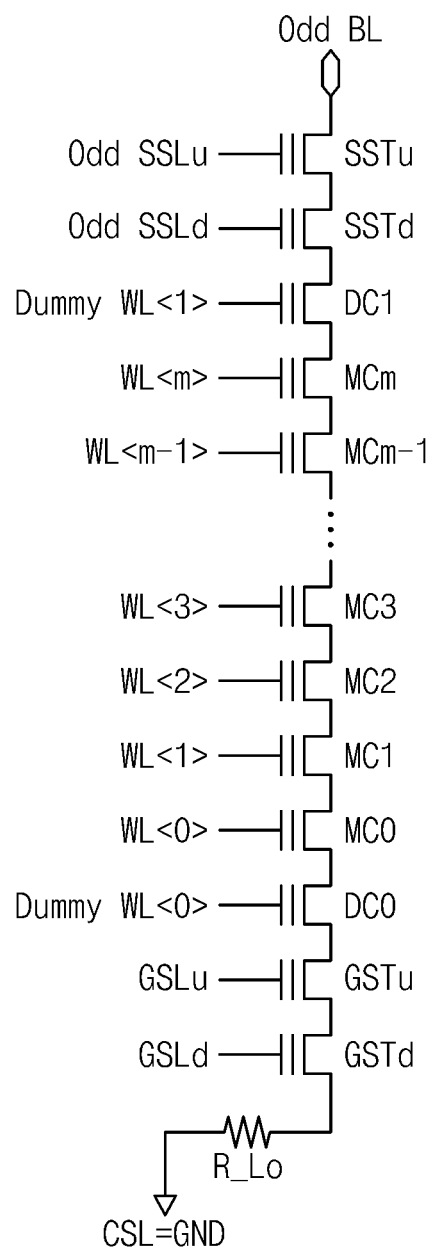
FIG. 7B is a circuit diagram illustrating a vertical string (odd vertical string) corresponding to odd pillars PLo1 and PLo2 in a merged word line structure according to example embodiments of inventive concepts.

FIG. 7B is a circuit diagram illustrating a vertical string (odd vertical string) corresponding to odd pillars PLo1 and PLo2 in a merged word line structure according to example embodiments of inventive concepts. Referring to FIG. 7B, the odd vertical string may be connected with a common source line CSL via a channel resistance R_Lo.

As illustrated in FIGS. 5, 6, 7A, and 7B, a vertical string connected with an even bit line BLe (hereinafter, referred to as an even vertical string) and a vertical string connected with an odd bit line BLo (hereinafter, referred to as an odd vertical string) may be connected with the common source line CSL via different channel resistances R_Le and R_Lo. That is, since an even vertical string and an odd vertical string are asymmetric in structure, an electrical property between operations on the even vertical string and the odd vertical string may be different.

With a nonvolatile memory device 100 according to example embodiments of inventive concepts, it is possible to reduce and/or minimize a difference between electrical properties caused due to an asymmetric structure of vertical strings at a sensing operation.

Below, a technique of compensating a sensing operation on vertical strings with an asymmetric structure will be more fully described. Herein, the compensating may be made to have the same sensing operation property with respect to memory cells having the same threshold voltage. That is, a sensing operation according to example embodiments of inventive concepts may utilize different sensing methods with respect to an even vertical string and an odd vertical string.

Figure 8:
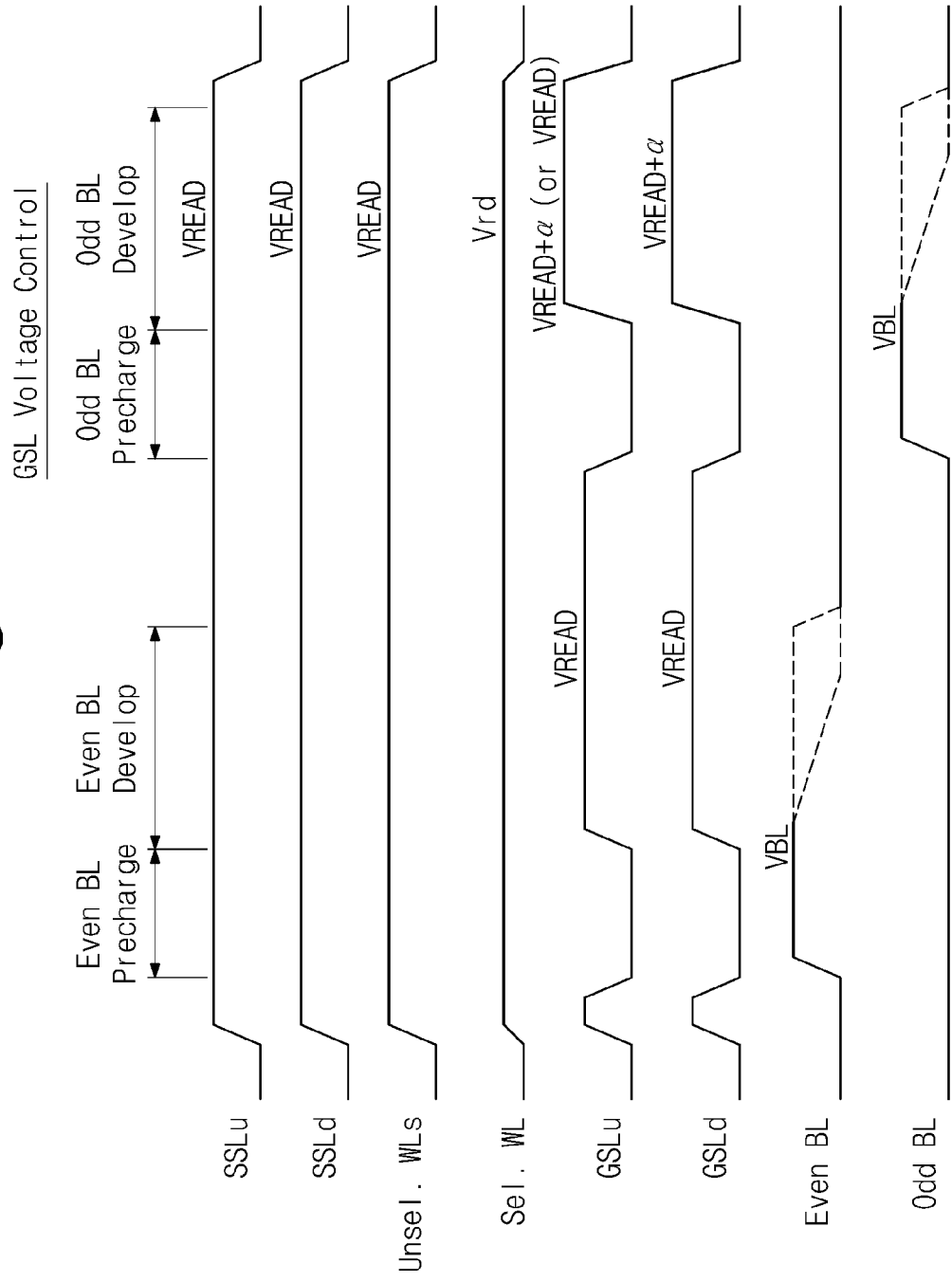
FIG. 8 is a diagram for describing a sensing operation of a nonvolatile memory device according to example embodiments of inventive concepts.

FIG. 8 is a diagram for describing a sensing operation of a nonvolatile memory device according to example embodiments of inventive concepts. Referring to FIGS. 7A, 7B, and 8, at a sensing operation of an even vertical string (e.g., a vertical string connected with an even bit line), a read pass voltage VREAD may be applied to ground selection lines GSLu and GSLd.

At a sensing operation of an odd vertical string (e.g., a vertical string connected with an odd bit line), a voltage higher by a desired (or alternatively predetermined) level than the read pass voltage VREAD may be applied to the ground selection lines GSLu and GSLd. That is, for an odd string having a channel resistance R_Lo larger than that R_Le of an even string, a larger current may flow via a channel by increasing a voltage applied to the ground selection lines GSLu and GSLd. An electrical property that discharging of a current to a common source line CSL is not made smoothly due to a larger channel resistance R_Lo may be compensated by making a larger current flow.

According to example embodiments of inventive concepts, at a sensing operation of an even vertical string (e.g., a vertical string connected with an even bit line), the read pass voltage VREAD may be applied to ground selection lines GSLu and GSLd. At a sensing operation of an odd vertical string (e.g., a vertical string connected with an odd bit line), the read pass voltage VREAD may be applied to the upper ground selection line GSLu, and a voltage higher by a desired (or alternatively predetermined) level than the read pass voltage VREAD may be applied to the lower ground selection line GSLd.

In addition, at a sensing operation, the read pass voltage VREAD may be applied to selection lines SSLu and SSLd and unselected word lines, and a read voltage Vrd may be applied to a selected word line.

Returning to FIG. 8, at an even bit line pre-charge period, an even bit line may be supplied with a pre-charge voltage VBL. At an even bit line develop period, a voltage of the even bit line may be lowered to a ground voltage or maintain the pre-charge voltage VBL according to data of a corresponding memory cell. Likewise, at an odd bit line pre-charge period, an odd bit line may be supplied with the pre-charge voltage VBL. At an odd bit line develop period, a voltage of the odd bit line may be lowered to a ground voltage or maintain the pre-charge voltage VBL according to data of a corresponding memory cell.

As illustrated in FIG. 8, voltages applied to the ground selection lines GSLu and GSLd may be varied according to an even vertical string and an odd vertical string. Accordingly, a sensing operation property of an odd bit line may be similar to a sensing operation property of an even bit line.

At a sensing operation, a voltage applied to a ground selection line may be controlled whether a vertical string is an even vertical string or an odd vertical string. However, example embodiments of inventive concepts are not limited thereto. For example, a voltage(s) of a string selection line SSL, a dummy word line, or unselected word lines can be controlled whether a vertical string is an even vertical string or an odd vertical string.

Figure 9:
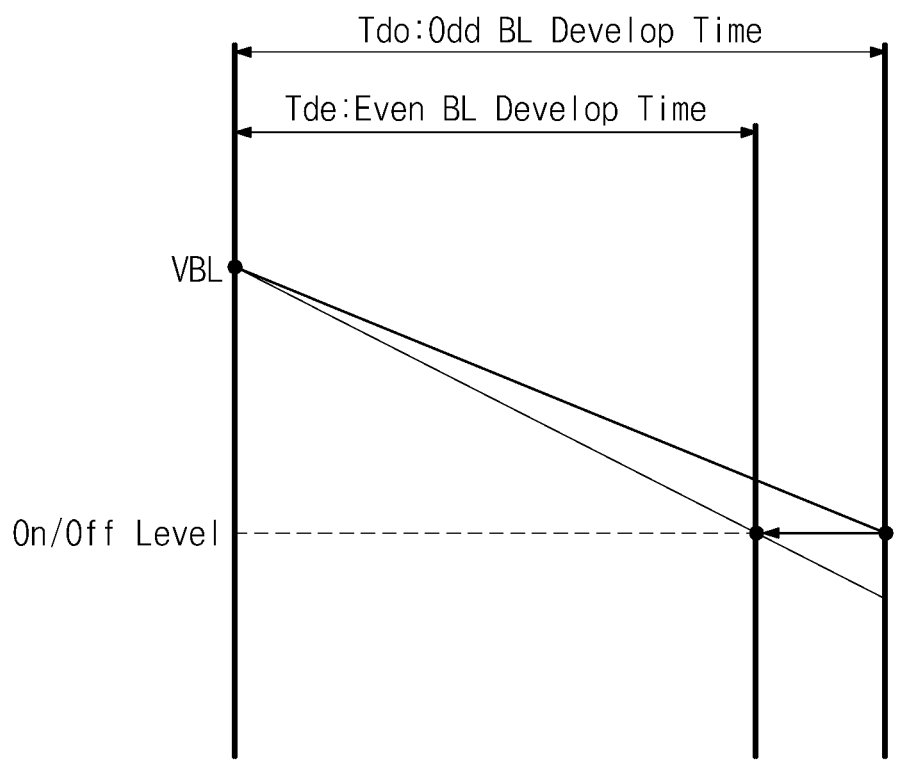
FIG. 9 is a diagram for describing a sensing operation of a nonvolatile memory device according to example embodiments of inventive concepts.

FIG. 9 is a diagram for describing a sensing operation of a nonvolatile memory device according to example embodiments of inventive concepts. Referring to FIG. 9, at a sensing operation, a develop time Tde of an even vertical string (e.g., a vertical string connected with an even bit line) may be shorter than a develop time Tdo of an odd vertical string (e.g., a vertical string connected with an odd bit line). That is, for an odd string having a channel resistance R_Lo larger than a channel resistance R_Le of an even string, a develop operation may be performed during a longer time. At a sensing operation of an odd string having a larger channel resistance R_Lo, erroneous judgment of an on/off cell may be reduced (and/or prevented) by developing a bit line during a sufficient time so as to be discharged to an on/off level from a pre-charge voltage VBL.

A sensing operation of a nonvolatile memory device according to example embodiments of inventive concepts can be implemented by a combination of a technique of controlling a voltage applied to a ground selection line GSL, described in relation to FIG. 8, and/or a technique of controlling a develop time described in relation to FIG. 9.

Figure 10:
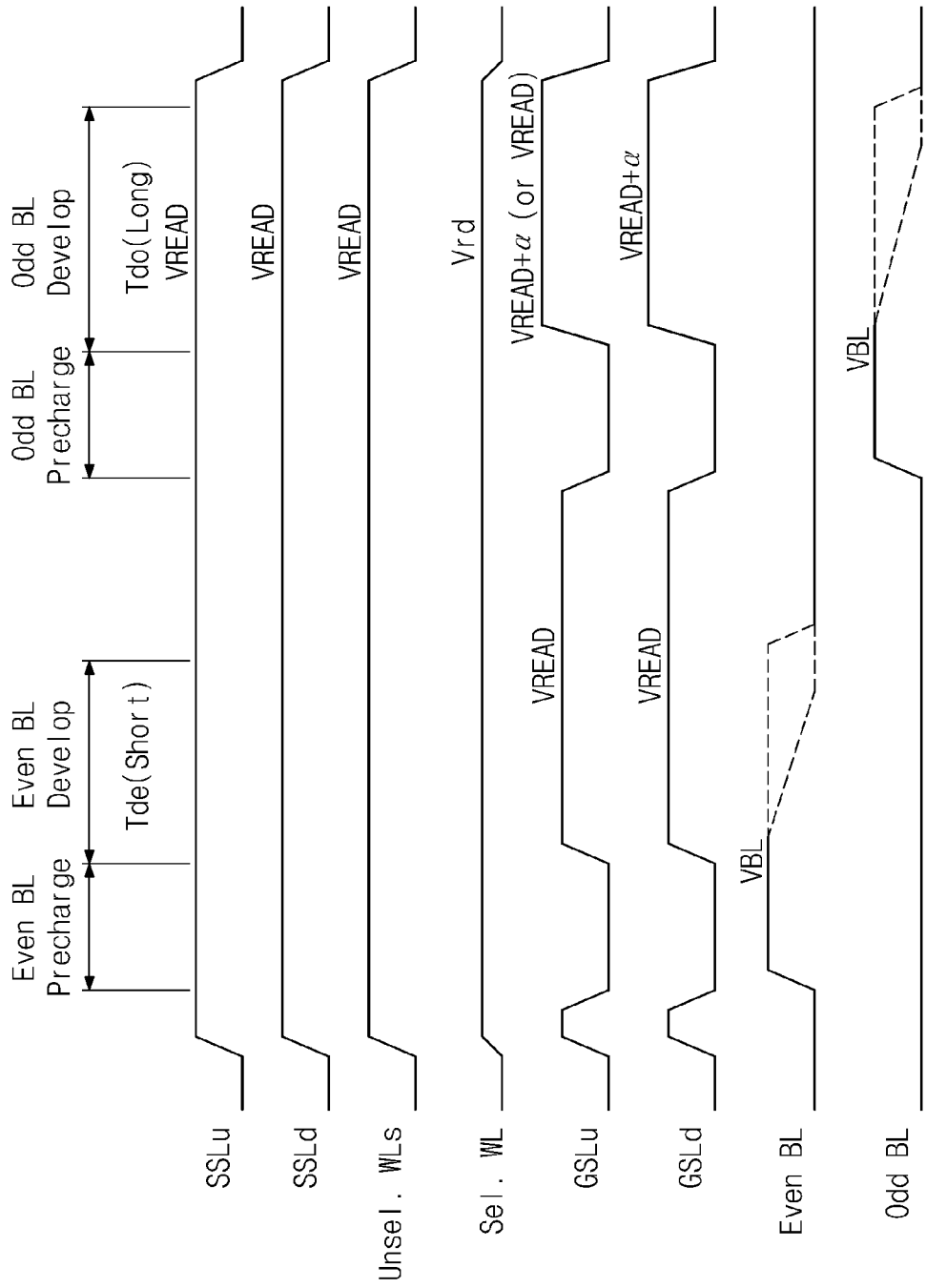
FIG. 10 is a diagram for describing a sensing operation of a nonvolatile memory device according to example embodiments of inventive concepts.

FIG. 10 is a diagram for describing a sensing operation of a nonvolatile memory device according to example embodiments of inventive concepts. Referring to FIGS. 7A, 7B, and 10, at a sensing operation of an even vertical string (e.g., a vertical string connected with an even bit line), a read pass voltage VREAD may be applied to ground selection lines GSLu and GSLd. At a sensing operation of an odd vertical string (e.g., a vertical string connected with an odd bit line), a voltage higher by a desired (or alternatively predetermined) level than the read pass voltage VREAD may be applied to the ground selection lines GSLu and GSLd. A develop time Tde of the even vertical string (e.g., a vertical string connected with the even bit line) may be shorter than a develop time Tdo of the even vertical string (e.g., a vertical string connected with the even bit line).

A memory block illustrated in FIG. 4 may have a merged word line structure, and two pillars illustrated in FIG. 5 may be arranged in a zigzag shape. However, example embodiments of inventive concepts are not limited thereto. Example embodiments of inventive concepts may be applicable to various structures where a plurality of pillars are arranged to have an asymmetric structure.

Figure 11:
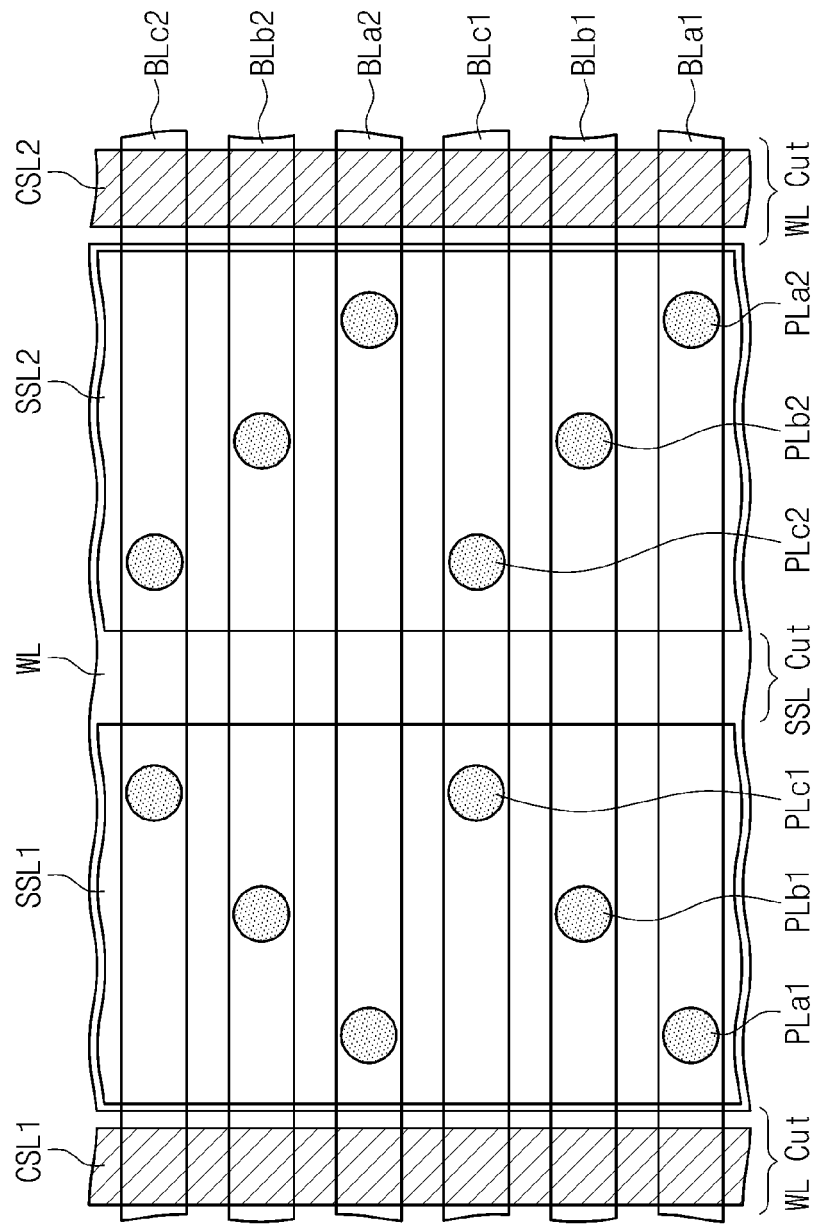
FIG. 11 is a diagram illustrating an asymmetric structure according to example embodiments of inventive concepts.

FIG. 11 is a diagram illustrating an asymmetric structure according to example embodiments of inventive concepts. Referring to FIG. 11, a channel length from first pillars PLa1 and PLa2 connected with a first bit line BLa1 and BLa2 to a common source line CSL1 and CSL2, a channel length from second pillars PLb1 and PLb2 connected with a second bit line BLb1 and BLb2 to the common source line CSL1 and CSL2, and a channel length from third pillars PLc1 and PLc2 connected with a third bit line BLc1 and BLc2 to the common source line CSL1 and CSL2 may be different from one another. Herein, the pillars PLa1, PLb1, and PLc1 may be arranged in a zigzag shape between the common source line CSL1 and CSL2 and a string selection line cut SSL Cut.

With a sensing operation according to example embodiments of inventive concepts, sensing on a memory cell connected with the first bit line BLa1 and BLa2, sensing on a memory cell connected with the second bit line BLb1 and BLb2, and sensing on a memory cell connected with the third bit line BLc1 and BLc2 may be made differently.

Figure 12:
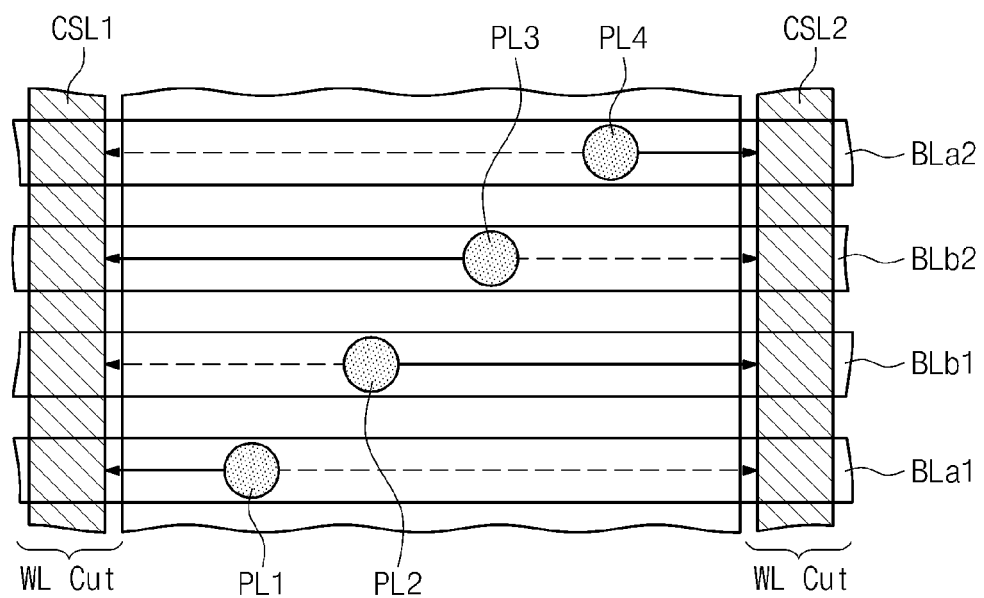
FIG. 12 is a diagram illustrating an asymmetric structure according to example embodiments of inventive concepts.

FIG. 12 is a diagram illustrating an asymmetric structure according to example embodiments of inventive concepts. Referring to FIG. 12, a channel length from pillars PL1 and PL4 connected with first bit lines BLa1 and BLa2 to a common source line CSL1 and CSL2 and a channel length from pillars PL2 and PL3 connected with second bit lines BLb1 and BLb2 to the common source line CSL1 and CSL2 may be different from one another. Herein, the pillars PL1, PL2, PL3, and PL4 may be arranged in a zigzag shape between the common source line CSL and a string selection line cut SSL Cut.

With a sensing operation according to example embodiments of inventive concepts, sensing of memory cells connected with the first bit lines BLa1 and BLa2 and sensing on memory cells connected with the second bit line BLb1 and BLb2 may be made differently.

Figure 13:
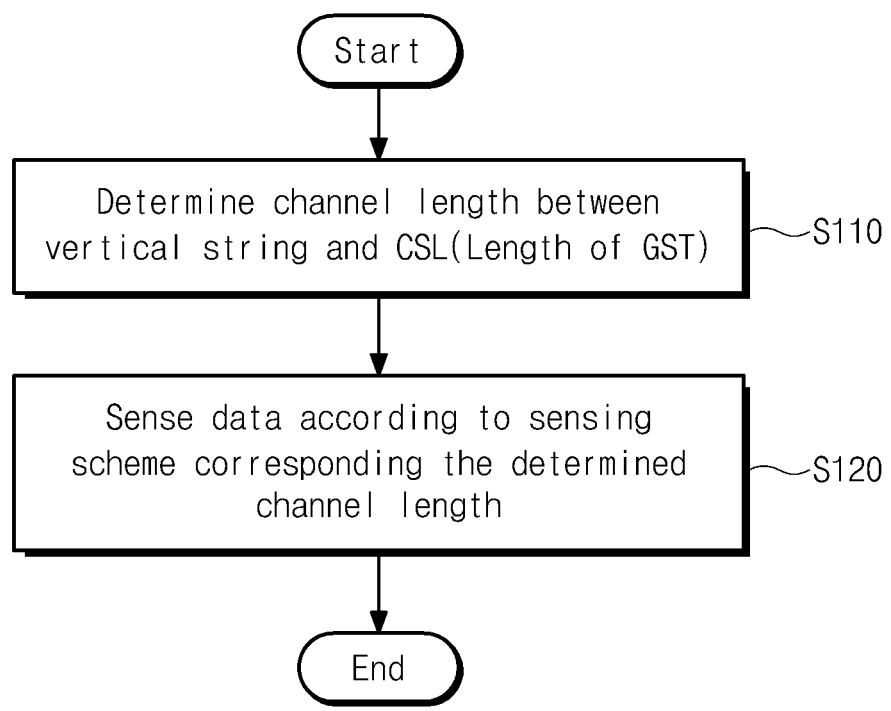
FIG. 13 is a flowchart illustrating a sensing method of a nonvolatile memory device according to example embodiments of inventive concepts.

FIG. 13 is a flowchart illustrating a sensing method of a nonvolatile memory device according to example embodiments of inventive concepts. Referring to FIGS. 1 and 13, in operation S110, control logic 150 may judge a channel length between a vertical string to be sensed and a common source line CSL. This may be judged according to whether a bit line connected with the vertical string is an even or odd bit line.

In operation 5120, the control logic 150 may sense data of a memory cell of the vertical string according to a sensing method corresponding to the judged channel length. Herein, the control logic 150 can perform a plurality of sensing methods. The control logic 150 may perform a sensing operation according to one of the plurality of sensing methods according to the determined channel length.

A nonvolatile memory device 100 according to example embodiments of inventive concepts may perform a sensing operation using a sensing method corresponding to a channel length between a vertical string and a common source line CSL.

Example embodiments of inventive concepts relate to various devices.

Figure 14:
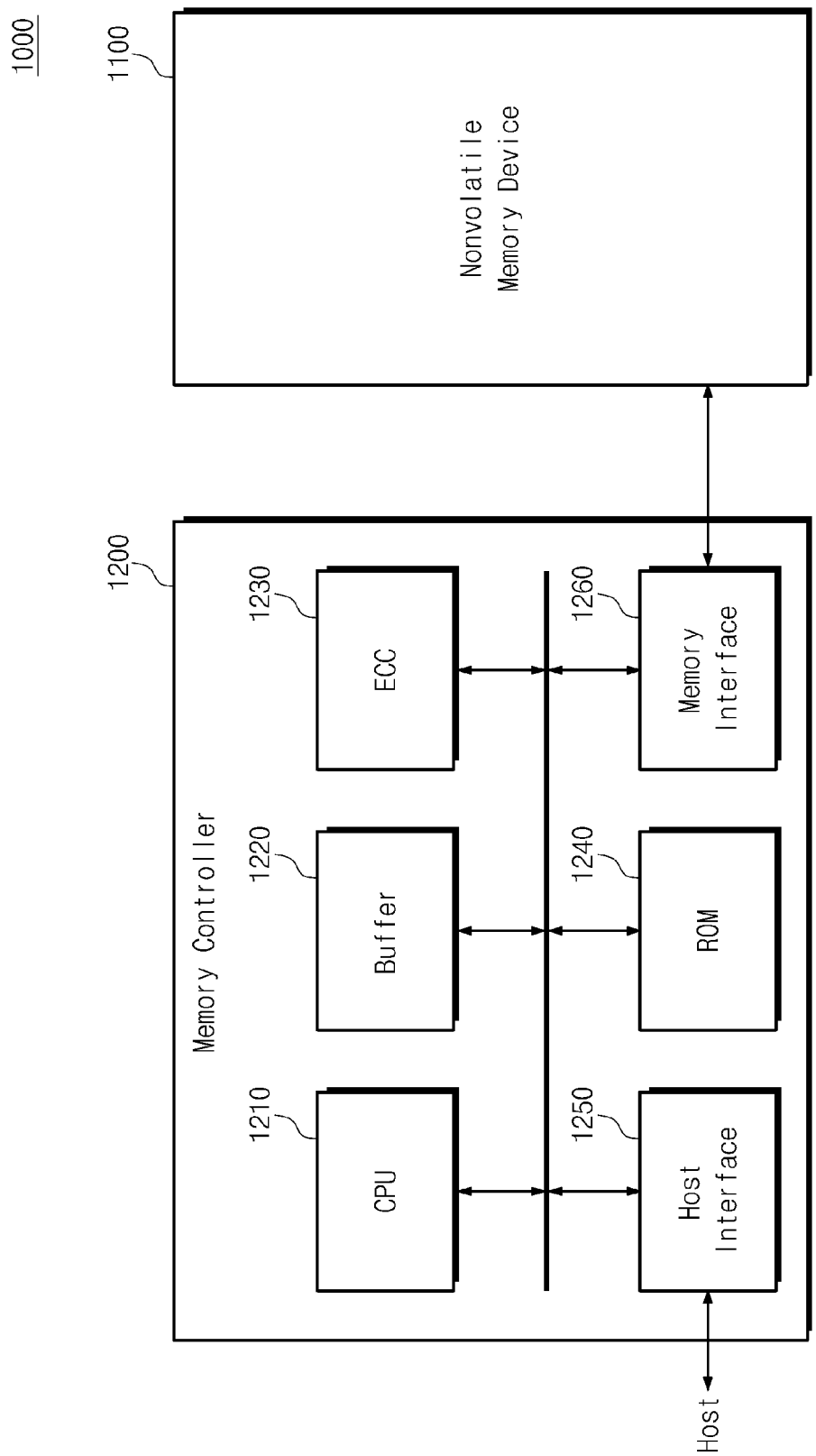
FIG. 14 is a diagram illustrating a memory system according to example embodiments of inventive concepts.

FIG. 14 is a diagram illustrating a memory system according to example embodiments of inventive concepts. Referring to FIG. 14, a memory system 1000 may include a nonvolatile memory device 1100 and a memory controller 1200. The nonvolatile memory device 1100 may be implemented the same as the nonvolatile memory device 100 of FIG. 1. The memory controller 1200 may include a CPU 1210, a Buffer 1220, an ECC 1230, a ROM 1240, a Host Interface 1250, and a memory interface 1260, operatively connected to each other. The memory system is more fully described in U.S. Patent Publication No. 2010-0082890, the entire disclosure of which is incorporated by reference herein.

Figure 15:
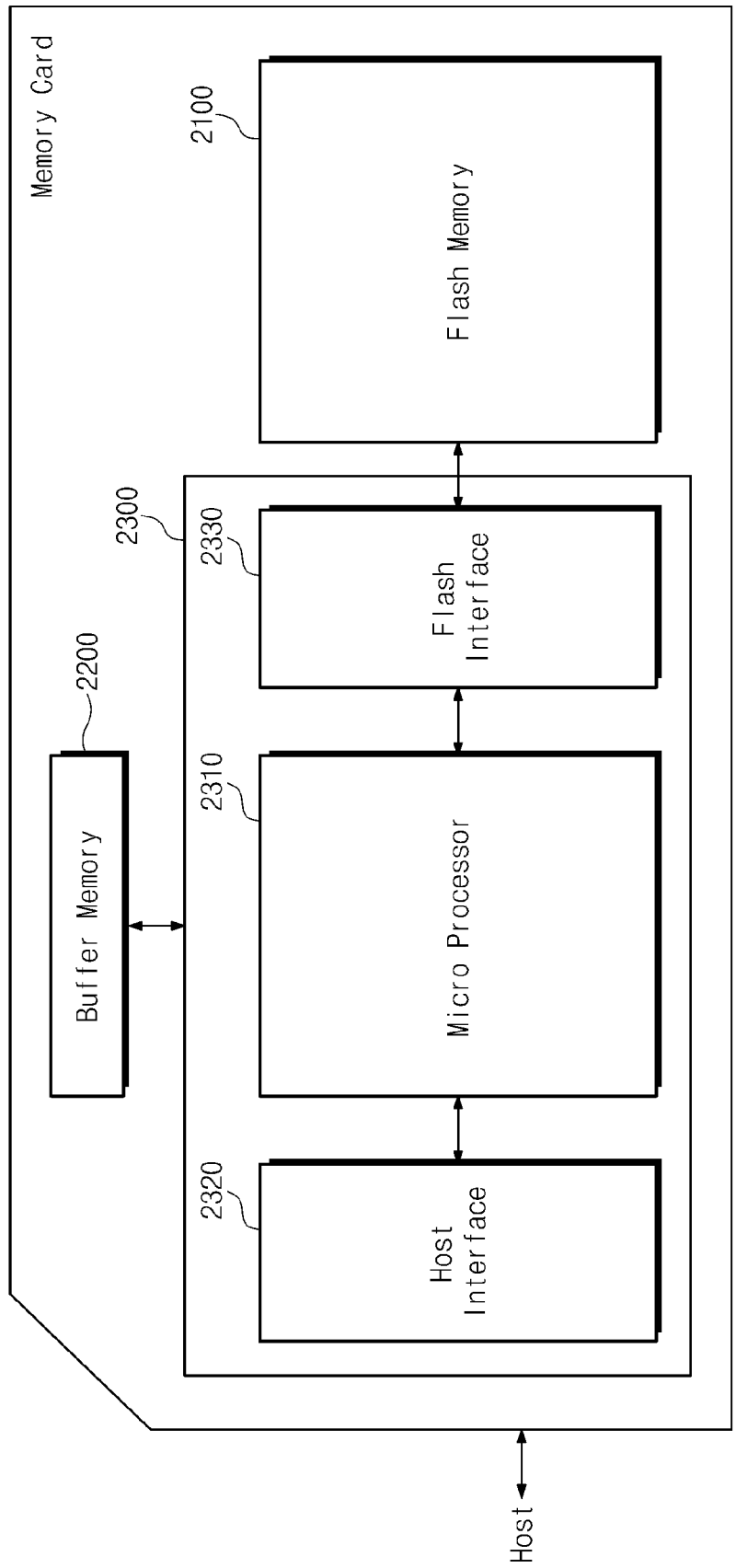
FIG. 15 is a block diagram illustrating a memory card according to example embodiments of inventive concepts.

FIG. 15 is a block diagram illustrating a memory card according to example embodiments of inventive concepts. Referring to FIG. 15, a memory card 2000 may include one flash memory 2100, a buffer memory device 2200, and a memory controller 2300 for controlling the flash memory 2100 and the buffer memory device 2200.

The flash memory device 2100 may be implemented the same as a nonvolatile memory device 100 of FIG. 1. The buffer memory device 2200 may be used to temporarily store data generated during the operation of the memory card 2000. The buffer memory device 2200 may be implemented using a DRAM or an SRAM, but example embodiments are not limited thereto.

The memory controller 2300 may be connected between a host and the flash memory 2100. The memory controller 2300 may be configured to access the flash memory 2100 in response to a request from the host. The memory controller 2300 may include a microprocessor 2310, a host interface 2320, and a flash interface 2330. The microprocessor 2310 may be configured to drive firmware. The host interface 2320 may interface with the host via a card protocol (e.g., MMC) for data exchanges between the host and the memory interface 2330.

The memory card 2000 may be applicable to Multimedia Cards (MMCs), Security Digitals (SDs), miniSDs, memory sticks, smartmedia, and transflash cards, but example embodiments are not limited thereto. Detailed description of the memory card 2000 is disclosed in U.S. Patent Publication No. 2010-0306583, the entire disclosure of which is incorporated by reference herein.

Figure 16:
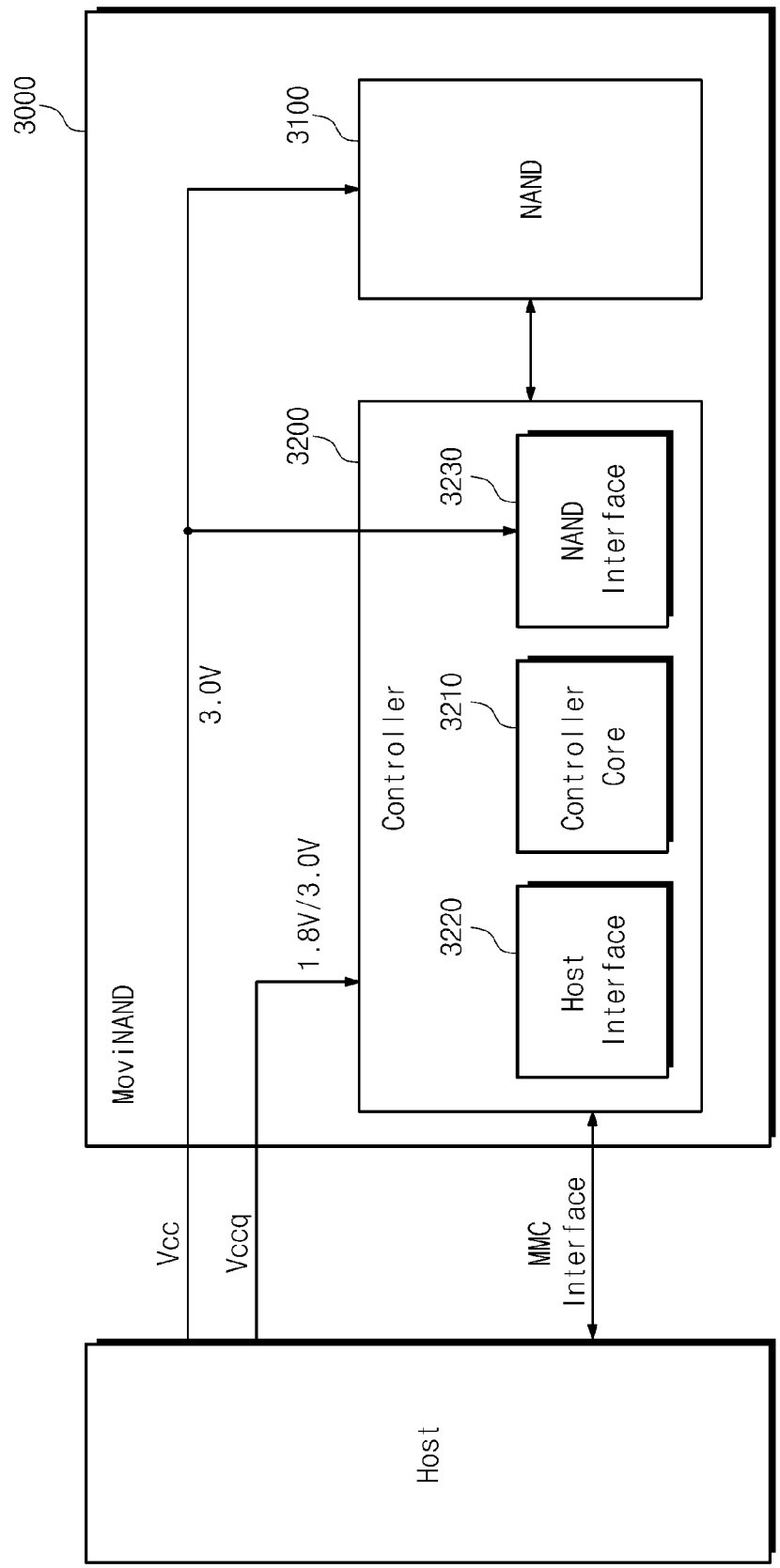
FIG. 16 is a block diagram illustrating a moviNAND according to example embodiments of inventive concepts.

FIG. 16 is a block diagram illustrating a moviNAND device according to example embodiments of inventive concepts. Referring to FIG. 16, a moviNAND device 3000 may include a NAND flash memory device 3100 and a controller 3200. The moviNAND device 3000 may support the MMC 4.4 (called eMMC) standard.

The NAND flash memory device 3100 may be formed by a stack of unitary NAND flash memories in a package (e.g., Fine-pitch Ball Grid Array (FBGA)). The unitary NAND flash memory device may be implemented the same as a nonvolatile memory device 100 of FIG. 1. The controller 3200 may include at least one controller core 3210, a host interface 3220, and a NAND interface 3230. The controller core 3210 may control an overall operation of the moviNAND device 3000. The host interface 3220 may be configured to perform an MMC interface between the controller 3210 and a host. The NAND interface 3230 may be configured to interface between the NAND flash memory device 3100 and the controller 3200. The moviNAND device 3000 may receive power supply voltages Vcc and Vccq from the host. Herein, the power supply voltage Vcc (about 3V) may be supplied to the NAND flash memory device 3100 and the NAND interface 3230, while the power supply voltage Vccq (about 1.8V/3V) may be supplied to the controller 3200.

The moviNAND 3000 according to example embodiments of inventive concepts may be advantageous to store mass data as well as may have an improved read characteristic. The moviNAND 3000 according to example embodiments of inventive concepts is applicable to small and low-power mobile products (e.g., a GALAXY S® (a mobile phone and/or smart phone marketed by Samsung Electronics Co., Ltd.), IPHONE® (a mobile phone and/or smart phone marketed by Apple Corporation), but example embodiments are not limited thereto).

Figure 17:
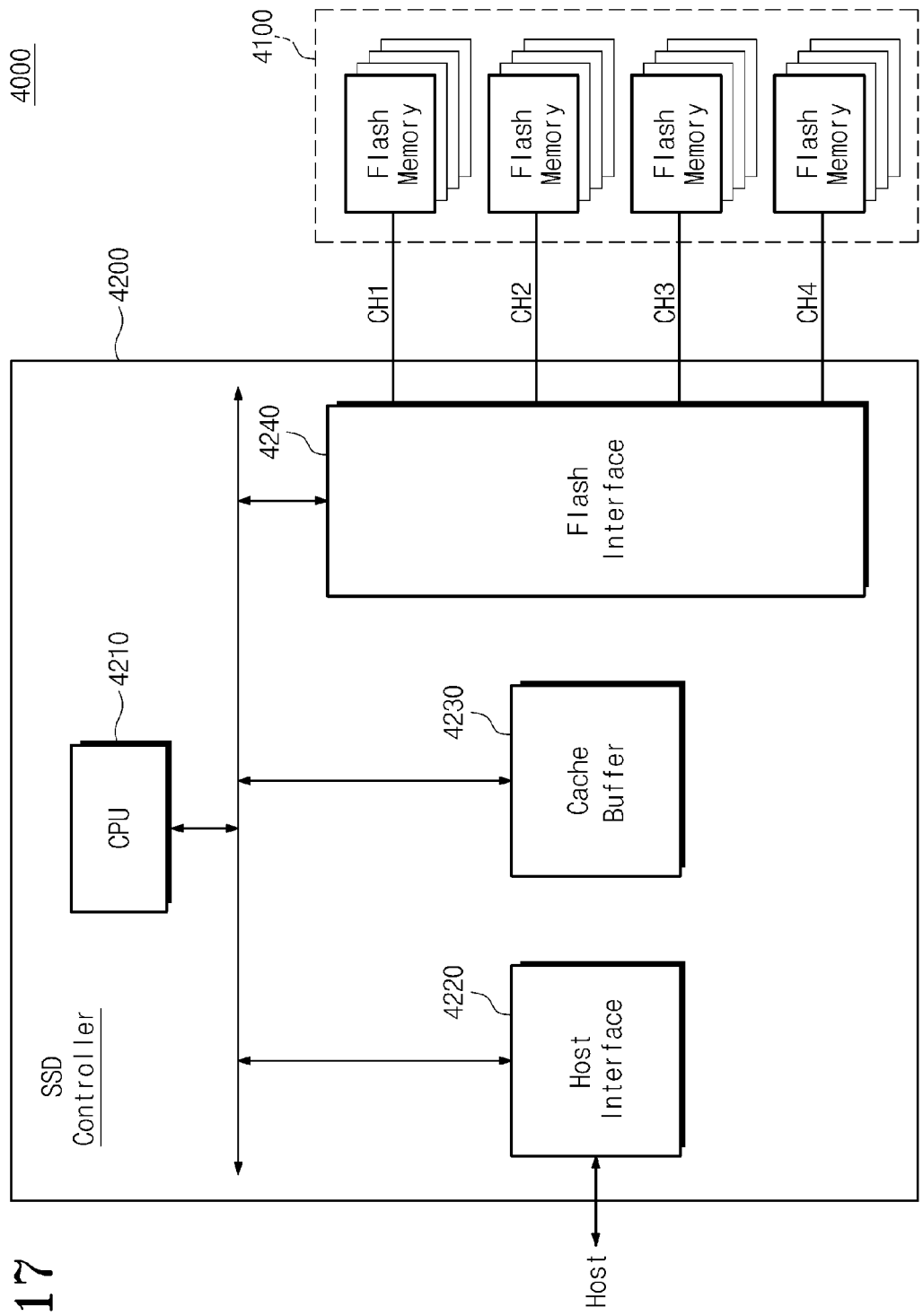
FIG. 17 is a block diagram of an SSD according to example embodiments of inventive concepts.

FIG. 17 is a block diagram of an SSD according to example embodiments of inventive concepts. Referring to FIG. 17, an SSD 4000 may include a plurality of flash memory devices 4100 and an SSD controller 4200.

Each of the flash memory devices 4100 may include the nonvolatile memory device 100 of FIG. 1. The SSD controller 4200 may control the plurality of flash memory devices 4100. The SSD controller 4200 may include a CPU 4210, a host interface 4220, a cache buffer 4230, and a flash interface 4240.

Under the control of the CPU 4210, the host interface 4220 may exchange data with a host through the ATA protocol. The host interface 4220 may be one of a Serial Advanced Technology Attachment (SATA) interface, a Parallel Advanced Technology Attachment (PATA) interface, and an External SATA (ESATA) interface, but example embodiments are not limited thereto. Data to be received or transmitted from or to the host through the host interface 4220 may be delivered through the cache buffer 4230 without passing through a CPU bus, under the control of the CPU 4210. The cache buffer 4230 may temporarily store data transferred between an external device and the flash memory devices 4100. The cache buffer 4230 may be used to store programs to be executed by the CPU 4210. The cache buffer 4230 may be implemented using an SRAM. The cache buffer 4230 in FIG. 17 may be included within the SSD controller 4200. However, example embodiments of inventive concepts are not limited thereto. The cache buffer 4230 according to example embodiments of inventive concepts can be outside of the SSD controller 4200.

The flash interface 4240 may be configured to interface between the SSD controller 4200 and the flash memory devices 4100 that are used as storage devices. The flash interface 4240 may be configured to support NAND flash memories, One-NAND flash memories, multi-level flash memories, or single-level flash memories, but example embodiments of inventive concepts are not limited thereto. More detailed description of the SSD 4000 is disclosed in U.S. Patent Publication No. 2010-0082890, the entire disclosure of which is incorporated by reference herein.

Figure 18:
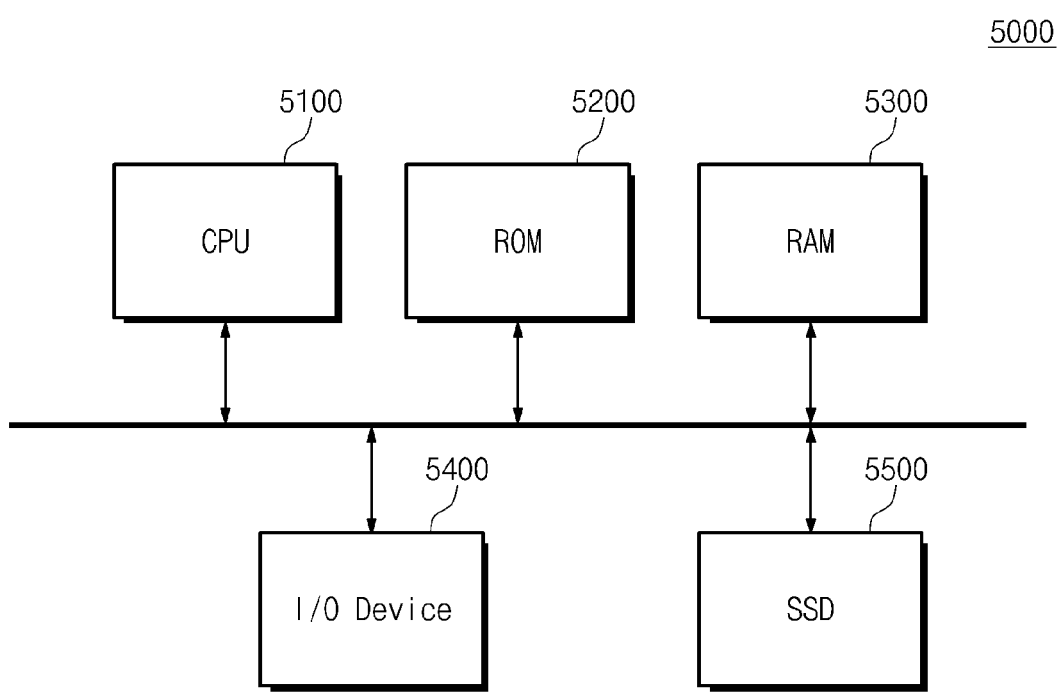
FIG. 18 is a block diagram of a computing system including an SSD in FIG. 17 according to example embodiments of inventive concepts.

FIG. 18 is a block diagram of a computing system including an SSD in FIG. 17 according to example embodiments of inventive concepts. Referring to FIG. 18, a computing system 5000 may include a CPU 5100, a ROM 5200, a RAM 5300, an input/output (I/O) device 5400, and at least one SSD 5500.

The CPU 5100 may be connected to a system bus. The ROM 5200 may store data used to drive the computing system 5000. Herein, the data may include a start command sequence or a basic I/O system (BIOS) sequence. The RAM 5300 may temporarily store data generated during the execution of the CPU 5100. The I/O device 5400 may be connected to the system bus through an I/O device interface such as keyboards, pointing devices (e.g., mouse), monitors, modems, and the like. The SSD 5500 may be a readable storage device and may be implemented the same as the SSD 4000 of FIG. 17.

Figure 19:
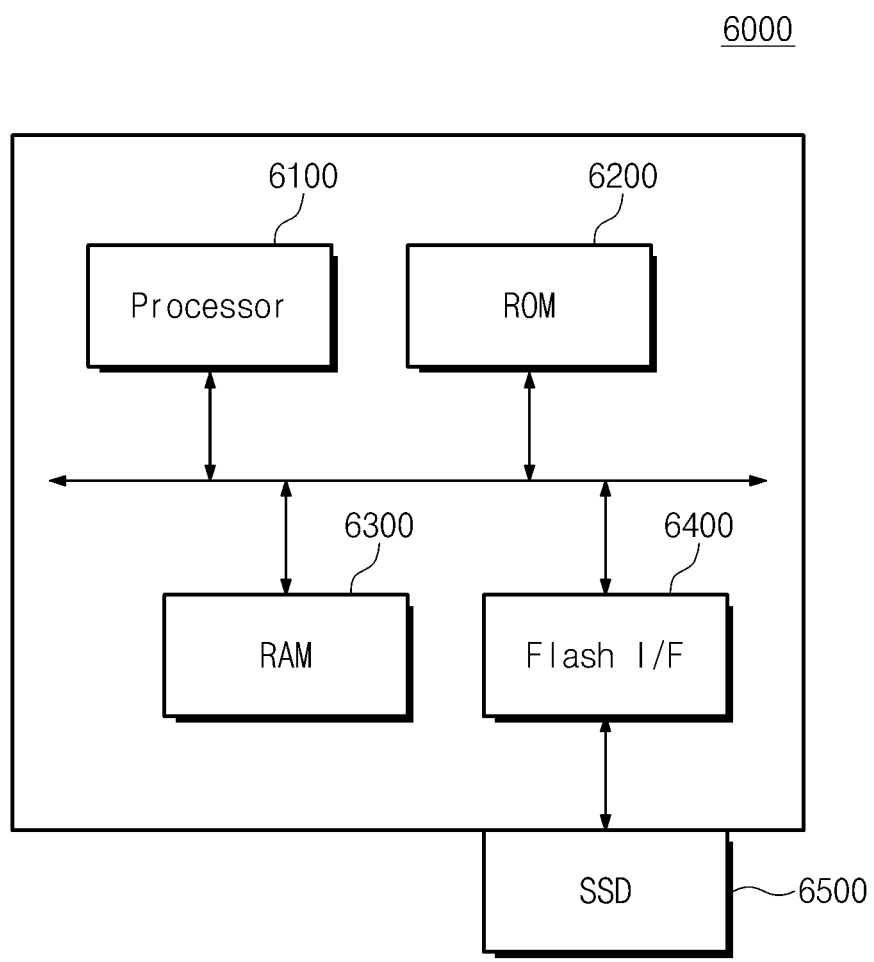
FIG. 19 is a block diagram of an electronic device including an SSD in FIG. 17 according to example embodiments of inventive concepts.

FIG. 19 is a block diagram of an electronic device including an SSD in FIG. 17 according to example embodiments of inventive concepts. Referring to FIG. 19, an electronic device 6000 may include a processor 6100, a ROM 6200, a RAM 6300, a flash interface 6400, and an SSD 6500.

The processor 6100 may access the RAM 6300 to execute firmware codes or other codes. Also, the processor 6100 may access the ROM 6200 to execute fixed command sequences such as a start command sequence and a basic I/O system (BIOS) sequence. The flash interface 6400 may be configured to interface between the electronic device 6000 and the SSD 6500. The SSD 6500 may be detachable from the electronic device 6000. The SSD 6500 may be implemented the same as the SSD 4000 of FIG. 17.

The electronic device 6000 may include cellular phones, personal digital assistants (PDAs), digital cameras, camcorders, portable audio players (e.g., MP3), and portable media players (PMPs), but example embodiments are not limited thereto.

Figure 20:
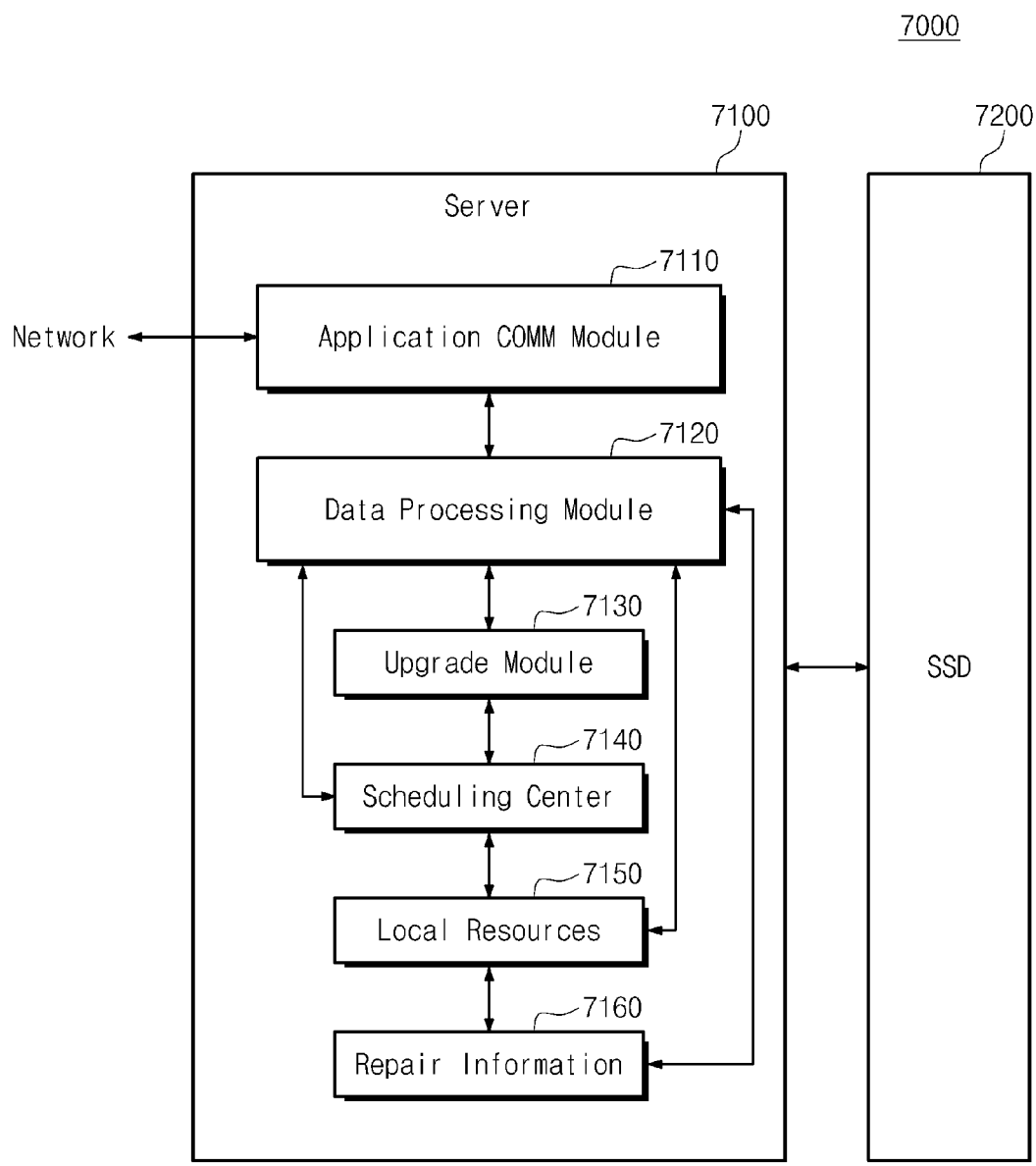
FIG. 20 is a block diagram of a server system including an SSD in FIG. 17 according to example embodiments of inventive concepts.

FIG. 20 is a block diagram of a server system including an SSD in FIG. 17 according to example embodiments of inventive concepts. Referring to FIG. 20, a server system 7000 may include a server 7100 and an SSD 7200 that stores data used to drive the server 7100. The SSD 7200 may be configured the same as an SSD 4000 of FIG. 17.

The server 7100 may include an application communication module 7110, a data processing module 7120, an upgrade module 7130, a scheduling center 7140, a local resource module 7150, and a repair information module 7160. The application communication module 7110 may be configured to communicate with a computing system connected to a network and the server 7100, or to allow the server 7100 to communicate with the SSD 7200. The application communication module 7110 may transmit data or information, provided through a user interface, to the data processing module 7120. The data processing module 7120 may be linked to the local resource module 7150. Here, the local resource module 7150 may provide a list of repair shops/dealers/technical information to a user on the basis of information or data inputted to the server 7100. The upgrade module 7130 may interface with the data processing module 7120. Based on information or data received from the SSD 7200, the upgrade module 7130 may perform upgrades of a firmware, a reset code, a diagnosis system, or other information on electronic appliances. The scheduling center 7140 may provide real-time options to the user based on the information or data inputted to the server 7100. The repair information module 7160 may interface with the data processing module 7120. The repair information module 7160 may be used to provide repair-related information (e.g., audio, video or document files) to the user. The data processing module 7120 may package information related to the information received from the SSD 7200. The packaged information may be transmitted to the SSD 7200 or may be displayed to the user.

A non-volatile memory device according to example embodiments of inventive concepts is applicable to tablet products (e.g., SAMSUNG GALAXY TAB® (a mobile telephone, smart phone, and/or a portable computer with a mobile phone feature marketed by Samsung Electronics Co., Ltd.), IPAD® (A handheld computing device for wireless networking in a retail environment, marketed by Apple Corporation), but example embodiments are not limited thereto).

A nonvolatile memory device 100 in FIG. 1 may be included in a computer-readable media of a handheld electronic device. More detailed description of the handheld electronic device 8000 is disclosed in FIG. 4 and column 7 line 5 to column 10 line 40 of U.S. Pat. No. 7,509,588. The disclosure of U.S. Pat. No. 7,509,588 is incorporated by reference herein in its entirety.

Figure 21:
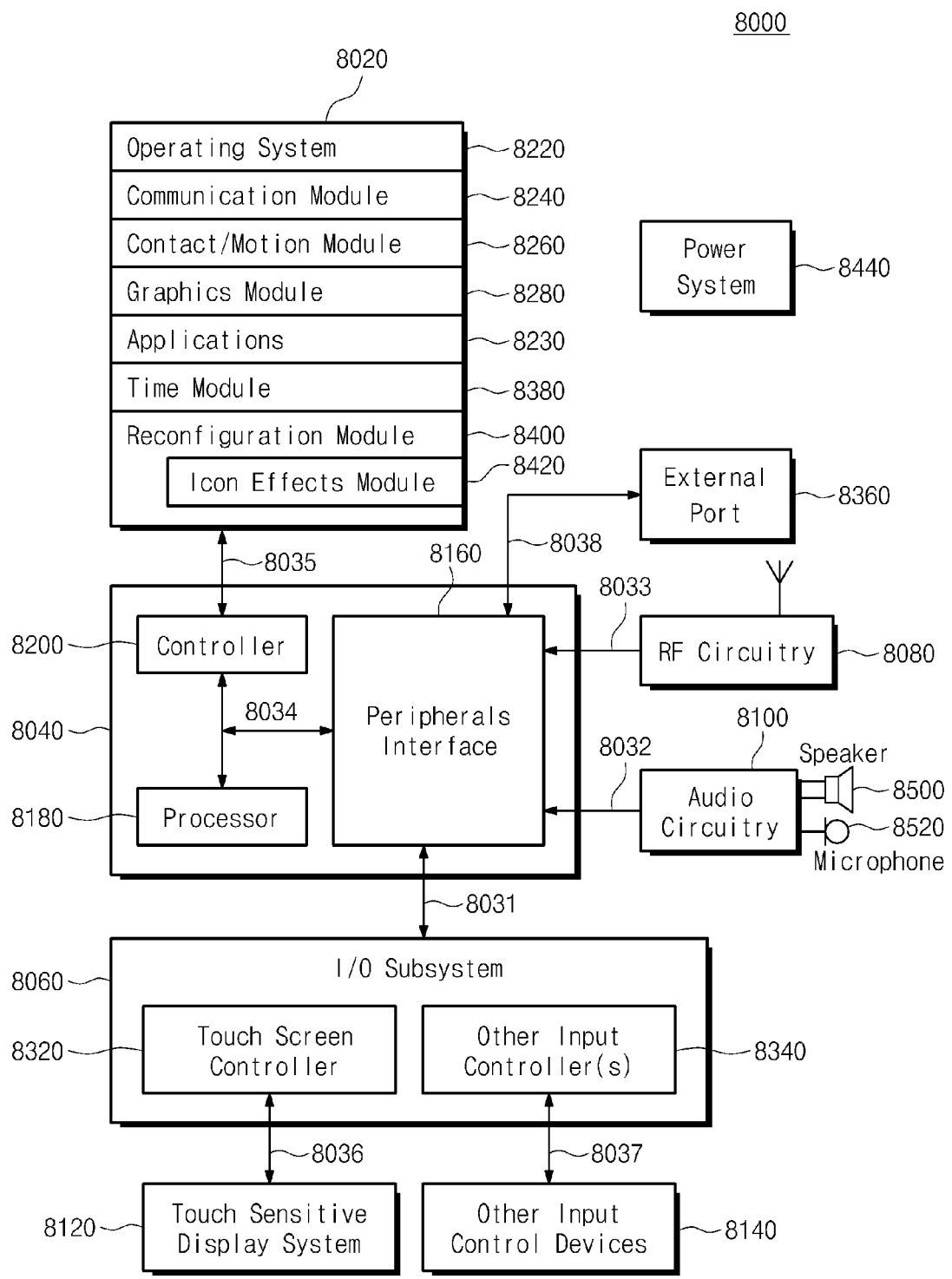
FIG. 21 is a diagram showing a handheld electronic device according to example embodiments of inventive concepts.

FIG. 21 is a diagram showing a handheld electronic device according to example embodiments of inventive concepts. Referring to FIG. 21, a handheld electronic device 8000 may include at least one computer-readable media 8020, a processing system 8040, an input/output sub-system 8060, a radio frequency circuit 8080, and an audio circuit 8100. Respective constituent elements can be interconnected by at least one communication bus or a signal line 8030.

The handheld electronic device 8000 may be any handheld electronic device including a handheld computer, a tablet computer, a mobile phone, a media player, a PDA, or a combination of at least two elements thereof, but example embodiments are not limited thereto. Herein, the at least one computer-readable media 8020 may include at least one nonvolatile memory device 100 in FIG. 1.

A memory system or a storage device according to example embodiments of inventive concepts may be mounted in various types of packages. Examples of the packages of the memory system or the storage device according to the inventive concept may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

While some example embodiments have been particularly shown and described, it will be understood by one of ordinary skill in the art that variations in form and detail may be made therein without departing from the spirit and scope of the claims.

What is claimed is:

1. A read method of a nonvolatile memory device comprising:
   selecting one of a plurality of vertical strings in a nonvolatile memory device, the plurality of vertical strings extending in a direction perpendicular to a substrate of the nonvolatile memory device;
   judging a channel length between a common source line and the selected one of the plurality of vertical strings;
   selecting a sensing manner corresponding to the judged channel length; and
   performing a sensing operation according to the selected sensing manner.

2. The read method of claim 1, wherein
   the nonvolatile memory device includes two of the plurality of vertical strings connected with a bit line between at least two word line cuts.

3. The read method of claim 1, wherein
   the nonvolatile memory device includes the plurality of vertical strings arranged in a zigzag structure between at least two word line cuts.

4. The read method of claim 3, wherein at least one corresponding vertical string of the plurality of vertical strings comprises:
   at least one string selection transistor connected between a bit line and a channel of the corresponding vertical string,
      the at least one string selection transistor including a gate connected with a string selection line; a plurality of cell transistors connected in series to form a channel of the corresponding vertical string,
      the plurality of cell transistors containing gates connected with word lines, respectively; and
   at least one ground selection transistor connected between the channel of the corresponding vertical string and the common source line,
      the at least one ground selection transistor including a gate connected with a ground selection line,
   wherein the at least one string selection transistor, the plurality of cell transistors, and the at least one ground selection transistor are stacked on the substrate.

5. The read method of claim 4, wherein the sensing operation includes controlling a bias voltage of the selected vertical string according to the selected sensing manner.

6. The read method of claim 5, wherein the sensing operation includes:
   controlling bias voltages of the word lines according to the selected sensing manner.

7. The read method of claim 5, wherein the sensing operation includes:
   controlling a voltage of the ground selection line according to the selected sensing manner.

8. The read method of claim 4, wherein the sensing operation includes:
   controlling a develop time according to the selected sensing manner.

9. The read method of claim 8, wherein, if the judged channel length is over a reference value, the sensing operation includes:
   making the develop time longer than a target develop time, according to the selected sensing manner.

10. The read method of claim 4, wherein the sensing operation includes:
    controlling a bias voltage of the selected vertical string and a develop time of the sensing operation according to the selected sensing manner.

11. A nonvolatile memory device comprising:
    a memory cell array including a plurality of memory blocks, each memory block including
    a plurality of vertical strings extending in a direction perpendicular to a substrate;
    an address decoder configured to decode an input address to generate a block selection signal;
    a block gating unit configured to select one of the plurality of memory blocks in response to the block selection signal;
    a read/write circuit connected with the memory cell array via bit lines and configured to exchange data with an external device; and
    a control logic configured to control the block gating unit, the address decoder, and the read/write circuit,
    wherein the control logic is configured to perform a read operation using a sensing manner selected according to a channel length between a selected vertical string and a common source line.

12. The nonvolatile memory device of claim 11, wherein each of the vertical strings includes at least one dummy cell containing a gate connected with a dummy word line.

13. The nonvolatile memory device of claim 11, wherein each of the vertical strings comprises:
    an upper string selection transistor connected with one end of a bit line and including a gate connected with an upper string selection line; and
    a lower string selection transistor connected between the upper string selection transistor and a channel of a corresponding vertical string and including a gate connected with a lower string selection line.

14. The nonvolatile memory device of claim II, wherein at least one corresponding vertical string of the plurality of vertical strings comprises:
   an upper ground selection transistor connected with one end of a channel of the corresponding vertical string, the ground selection transistor including a gate connected with an upper ground selection line; and
   a lower ground selection transistor connected between the upper ground selection transistor and the common source line, the lower ground selection transistor including a gate connected with a lower ground selection line.

15. The nonvolatile memory device of claim 11, wherein each of the memory blocks includes at least two vertical strings in a zigzag pattern between at least two word line cuts.

16. The nonvolatile memory device of claim 11, wherein, in each memory block,
   the plurality of vertical strings include a first plurality of vertical strings and a second plurality of vertical strings, and
   the first plurality of vertical strings have a shorter channel length to an adjacent common source line compared to the second plurality of vertical strings.

17. The nonvolatile memory device of claim 11, wherein, in each memory block,
   the plurality of vertical strings include a first vertical string and a second vertical string,
   the first and second vertical strings have different channel lengths to an adjacent common source line,
   the first and second vertical strings are connected to different bit lines,
   the first and second vertical strings are connected to a same ground select line, and
   the control logic is configured to at least one of,
      adjust a value of a read pass voltage applied to the same ground select line during the read operation according to whether the first or second vertical string is the selected vertical string, and
      adjust a duration of a pre-charge voltage applied to one of the different bit lines connected to the selected vertical string according to whether the first or second vertical string is the selected vertical string.

18. A nonvolatile memory device comprising:
   a memory cell array including a plurality of memory blocks,
      each memory block including a first string and a second string extending vertically from a substrate,
      a first channel length between the first string and a first common source line, and
      a second channel length between the second string and the first common source line,
      the second channel length being greater than the first channel length;
   a control logic configured to adjust a sensing operation on at least one of the first string and the second string, such that the sensing operation compensates for the second channel length being greater than the first channel length.

19. The nonvolatile memory device of claim 18, wherein the control logic is configured to adjust the sensing operation by:
   applying a first read pass voltage to at least one ground selection line of the first string when the first string is accessed; and
   applying a second read pass voltage to at least one ground selection line of the second string when the second string is accessed,
      the second read pass voltage being higher than the first read pass voltage.

20. The nonvolatile memory device of claim 18, wherein the control logic is configured to adjust the sensing operation by adjusting a develop time of the sensing operation based on whether the first string or second string is accessed.

21. The nonvolatile memory device of claim 18, wherein at least one of the memory blocks includes a merged word line structure.

22. A memory system comprising:
   at least one nonvolatile memory device according to claim 18; and
   a processor operatively connected to the at least one nonvolatile memory device.

* * * * *